(12) United States Patent
Behar et al.

(10) Patent No.: US 8,136,418 B2
(45) Date of Patent: Mar. 20, 2012

(54) ELECTROMECHANICAL ACTUATING ASSEMBLY

(75) Inventors: Bruce W. Behar, Pasadena, CA (US); James E. Flatt, Portage, MI (US); David J. Gurrola, Fillmore, CA (US); Dan T. Nguyen, Irvine, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 408 days.

(21) Appl. No.: 12/534,168

(22) Filed: Aug. 3, 2009

(65) Prior Publication Data

US 2009/0289145 A1 Nov. 26, 2009

(51) Int. Cl.
*F16H 3/06* (2006.01)
*B64C 17/00* (2006.01)

(52) U.S. Cl. ..................................... 74/89.23; 244/99.2

(58) Field of Classification Search .................. 244/231, 244/99.2–99.4; 318/3–13, 568.17, 156, 244, 318/255, 671; 74/496, 424.8 R, 424.8 B, 74/89.15, 459, 89.38, 89.29, 406, 89.25, 74/89.3; 475/1
See application file for complete search history.

(56) References Cited

U.S. PATENT DOCUMENTS

| | | | |
|---|---|---|---|
| 3,958,779 A | 5/1976 | Townsend | |
| 4,544,052 A | 10/1985 | Borden | |
| 4,575,027 A | 3/1986 | Cronin | |
| 4,608,527 A | 8/1986 | Glennon et al. | |
| 4,637,272 A | 1/1987 | Teske et al. | |
| 4,877,120 A | 10/1989 | Tysver et al. | |
| 4,885,939 A | 12/1989 | Martin | |
| 4,932,613 A | 6/1990 | Tiedeman et al. | |
| 4,979,700 A | 12/1990 | Tiedeman et al. | |
| 5,071,397 A | 12/1991 | Grimm | |
| 5,120,285 A | 6/1992 | Grimm | |
| 5,144,851 A | 9/1992 | Grimm et al. | |
| 5,214,972 A | 6/1993 | Larson et al. | |
| 5,518,466 A | 5/1996 | Tiedeman | |
| 5,779,587 A | 7/1998 | Reilly | |
| 5,947,246 A | 9/1999 | Koller | |
| 6,231,012 B1 | 5/2001 | Cacciola et al. | |
| 6,260,799 B1 | 7/2001 | Russ | |
| 6,443,034 B1 | 9/2002 | Capewell et al. | |
| 6,705,570 B1 | 3/2004 | Degenholtz et al. | |
| 6,860,452 B2 | 3/2005 | Bacon et al. | |
| 7,100,870 B2 | 9/2006 | Flatt | |
| 7,410,132 B1 | 8/2008 | Flatt | |
| 2003/0015982 A1 | 1/2003 | Cox-Smith et al. | |
| 2003/0127569 A1 | 7/2003 | Bacon et al. | |
| 2004/0007923 A1 | 1/2004 | Tesar | |
| 2006/0048602 A1 | 3/2006 | Biester | |
| 2006/0113933 A1 | 6/2006 | Blanding et al. | |

FOREIGN PATENT DOCUMENTS

GB 1393758 5/1975

OTHER PUBLICATIONS

PCT/US2008/053273; PCT International Search Report dated Jun. 5, 2009.
PCT/US2007/077507; Partial International Search mailed Jun. 15, 2009.

*Primary Examiner* — Tien Dinh
*Assistant Examiner* — Nicholas McFall
(74) *Attorney, Agent, or Firm* — Renner, Otto, Boisselle & Sklar LLP

(57) ABSTRACT

An electromechanical actuating assembly (100), operable in a plurality of fault-tolerant modes to accommodate at least the most probable fault situations. In the M1D1-only mode, actuator-moving power is transferred only through the first drivetrain (400A) and decoupling power transmitted through the second decoupling train (600B) decouples the second drivetrain (400B) from the actuator (200). In the M2D2-only mode, actuator-moving power is transferred only through the second drivetrain (400B) and decoupling power transmitted through the first decoupling train (600A) decouples the first drivetrain (400A) from the actuator (200).

19 Claims, 16 Drawing Sheets

ELECTROMECHANICAL ACTUATING ASSEMBLY

RELATED APPLICATIONS

This application claims priority under 35 U.S.C §120 to International Patent Application No. PCT/US08/53273 filed on Feb. 7, 2008, which claimed priority to U.S. Provisional Patent Application No. 60/888,666 filed on Feb. 7, 2007; U.S. Provisional Patent Application No. 60/892,310 filed on Mar. 1, 2007; U.S. Provisional Patent Application No. 60/976,021 filed on Sep. 28, 2007; and International Patent Application No. PCT/US07/77507 filed on Sep. 4, 2007. International Patent Application No. PCT/US08/53273 can also be considered a continuation-in-part of International Patent Application No. PCT/US07/77507. The entire disclosures of these applications are hereby incorporated by reference.

BACKGROUND

An aircraft commonly comprises control-surface components (e.g., stabilizers, rudders, elevators, flaps, ailerons, spoilers, slats, etc.) that are selectively moved during flight among a plurality of positions. Selective movement can be achieved by an actuating assembly comprising an actuator, to which the control-surface component is attached, and means for providing actuator-moving power to the actuator. Movement of aircraft control-surface components is crucial in flight, whereby an actuating assembly must consistently and dependably perform during normal operation. The actuating assembly must also be prepared to survive fault conditions falling outside normal operation, and preferably accommodate the most probable fault situations without compromise of actuator control.

SUMMARY

An electromechanical actuating assembly (i.e., an EMA assembly) is operable in a plurality of fault-tolerant modes whereby it can survive fault conditions outside normal operation. In at least two of these modes, the EMA assembly accommodates the most probable fault conditions (e.g., single-drive-train-jam without motor malfunction) while maintaining control of the actuator. These modes of operation are testable thereby permitting evaluations (e.g., preflight inspections) of the EMA assembly to confirm that it is prepared for fault situations.

DRAWINGS

DESCRIPTION

Figure 1:
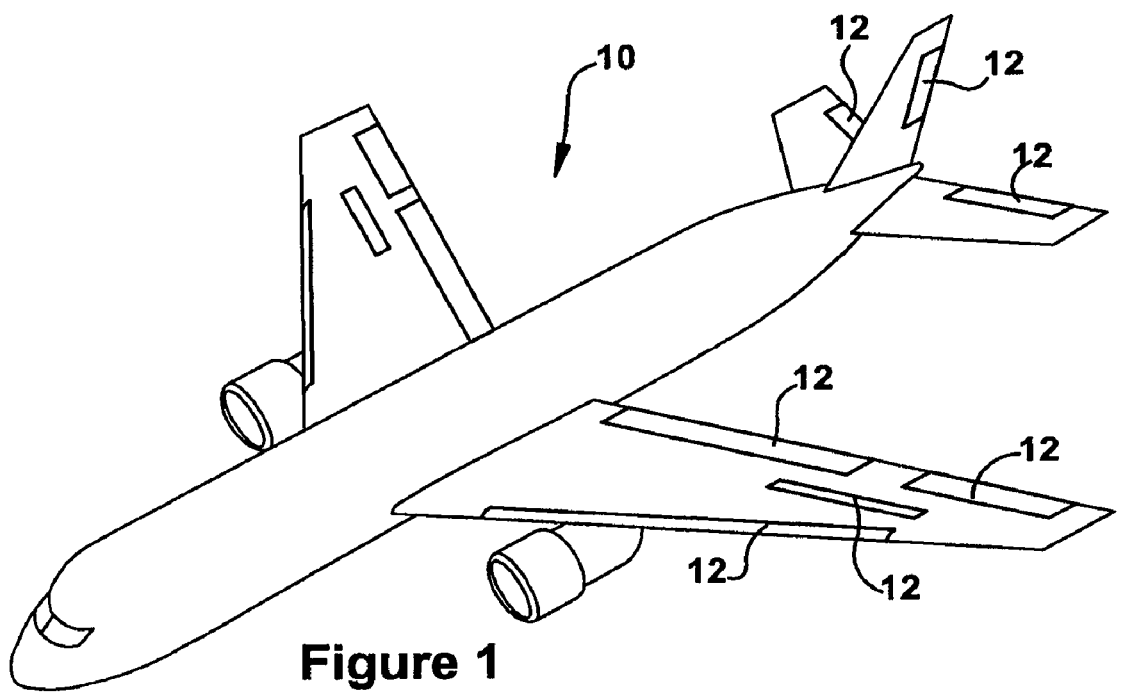
FIG. 1 shows an aircraft having flight-control-surface components which may be selectively moved by the EMA assembly.
Figure 2A:
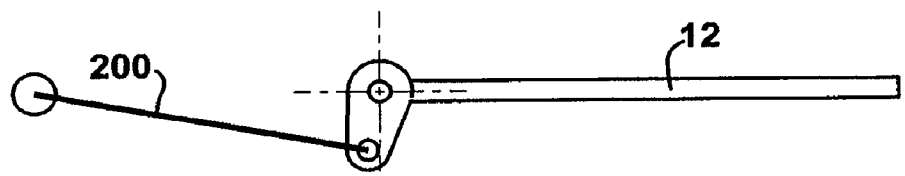
FIGS. 2A-2C show the movement of a flight-control-surface component by the EMA assembly.
Figure 2B:
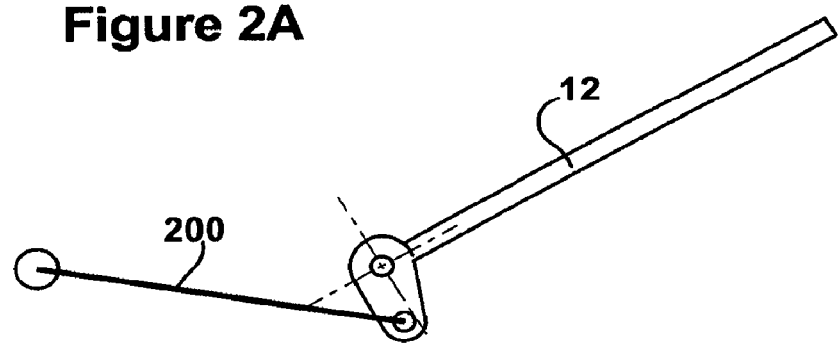
Figure 2C:
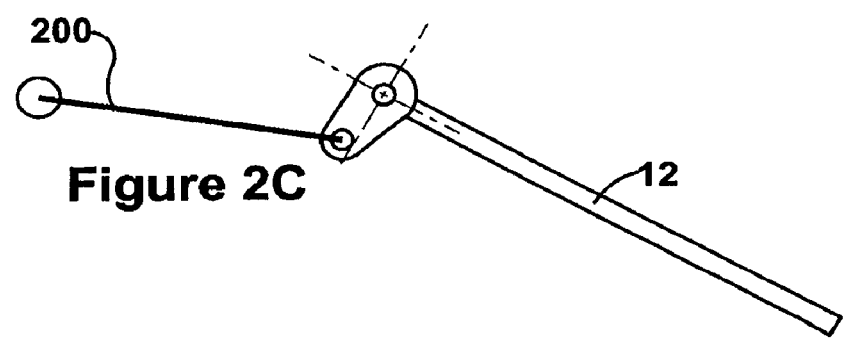
Figure 3:
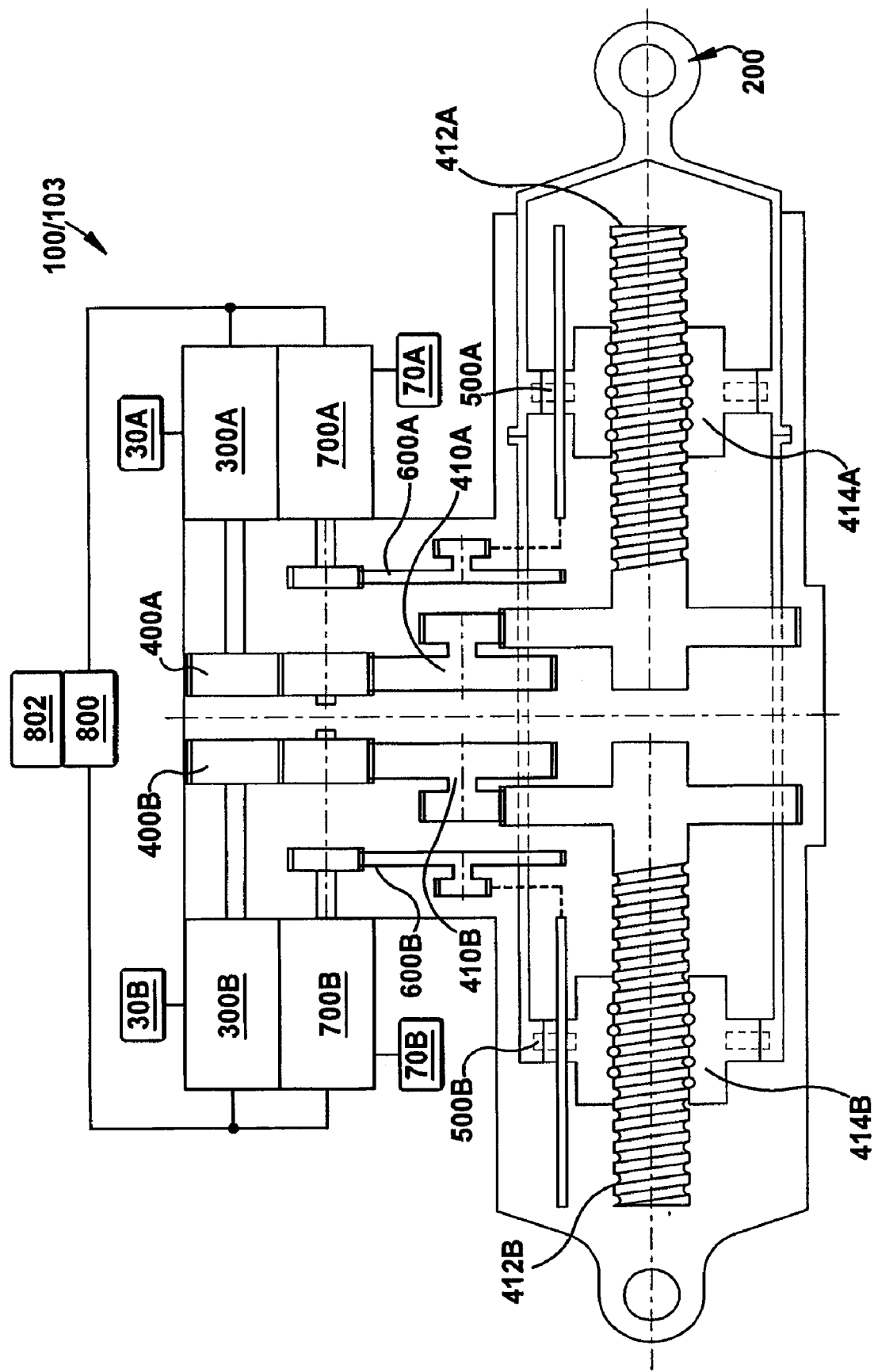
FIGS. 3-11 are diagrams of possible mechanical-electrical layouts for the EMA assembly.
Figure 4:
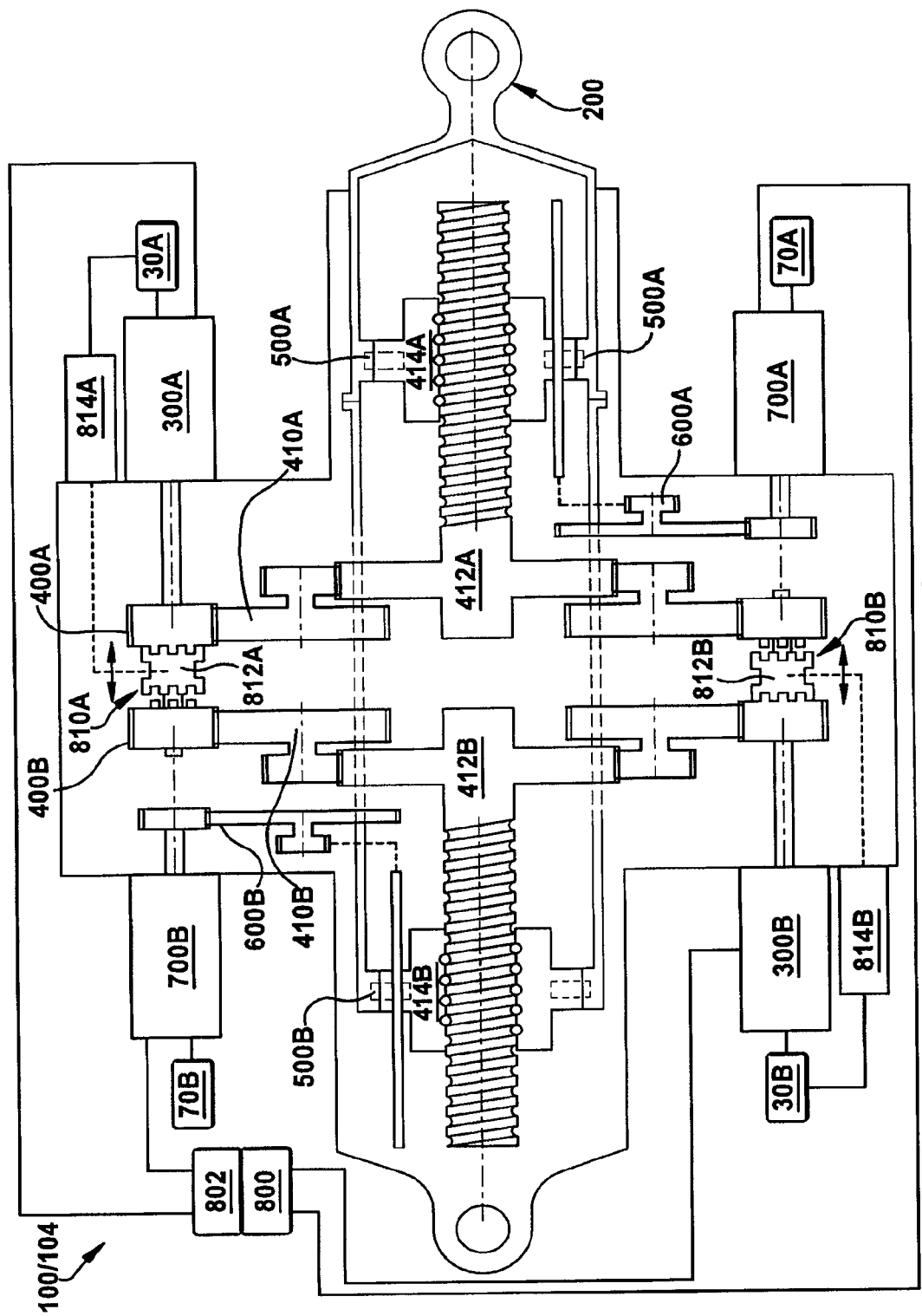
Figure 5:
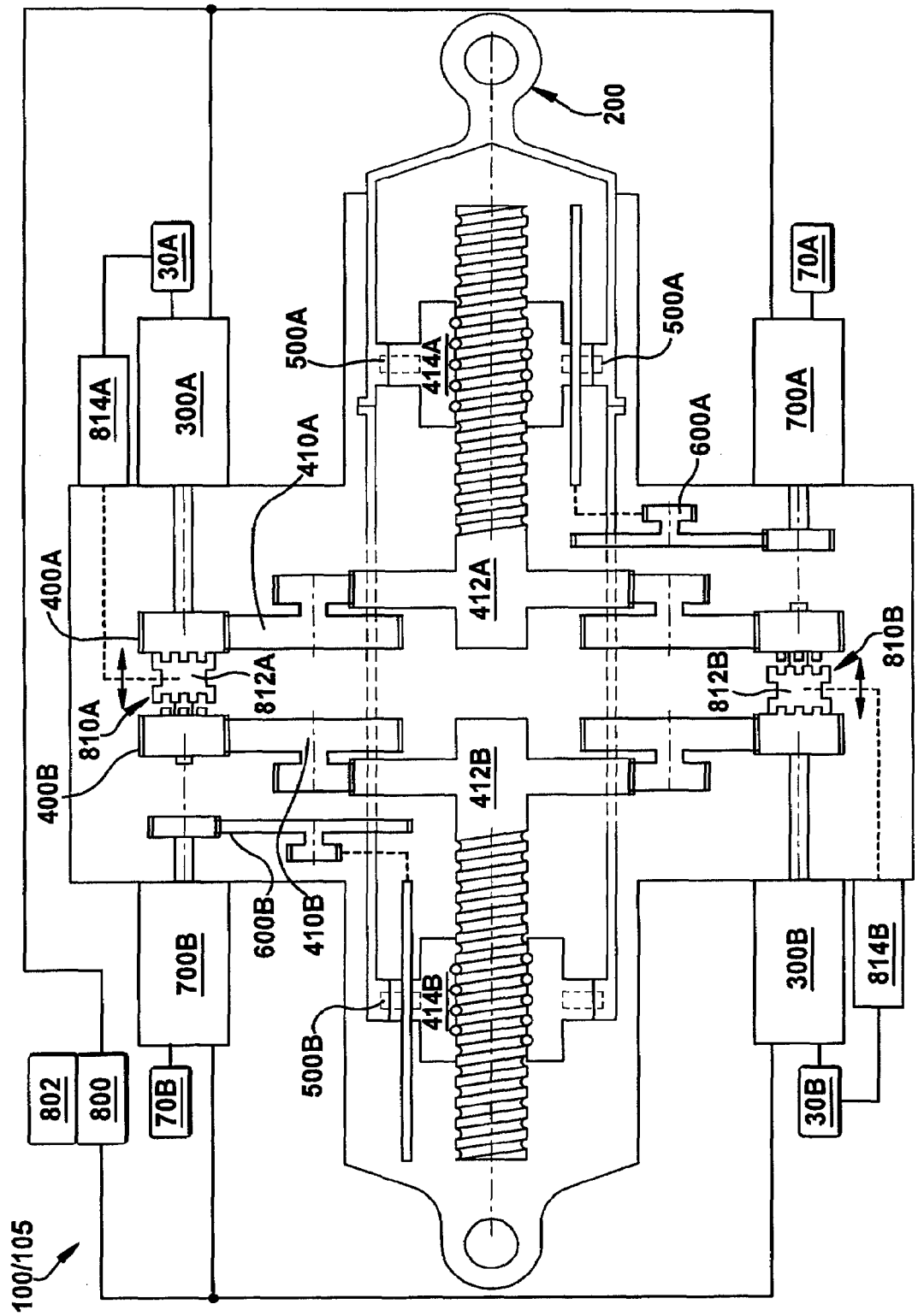
Figure 6:
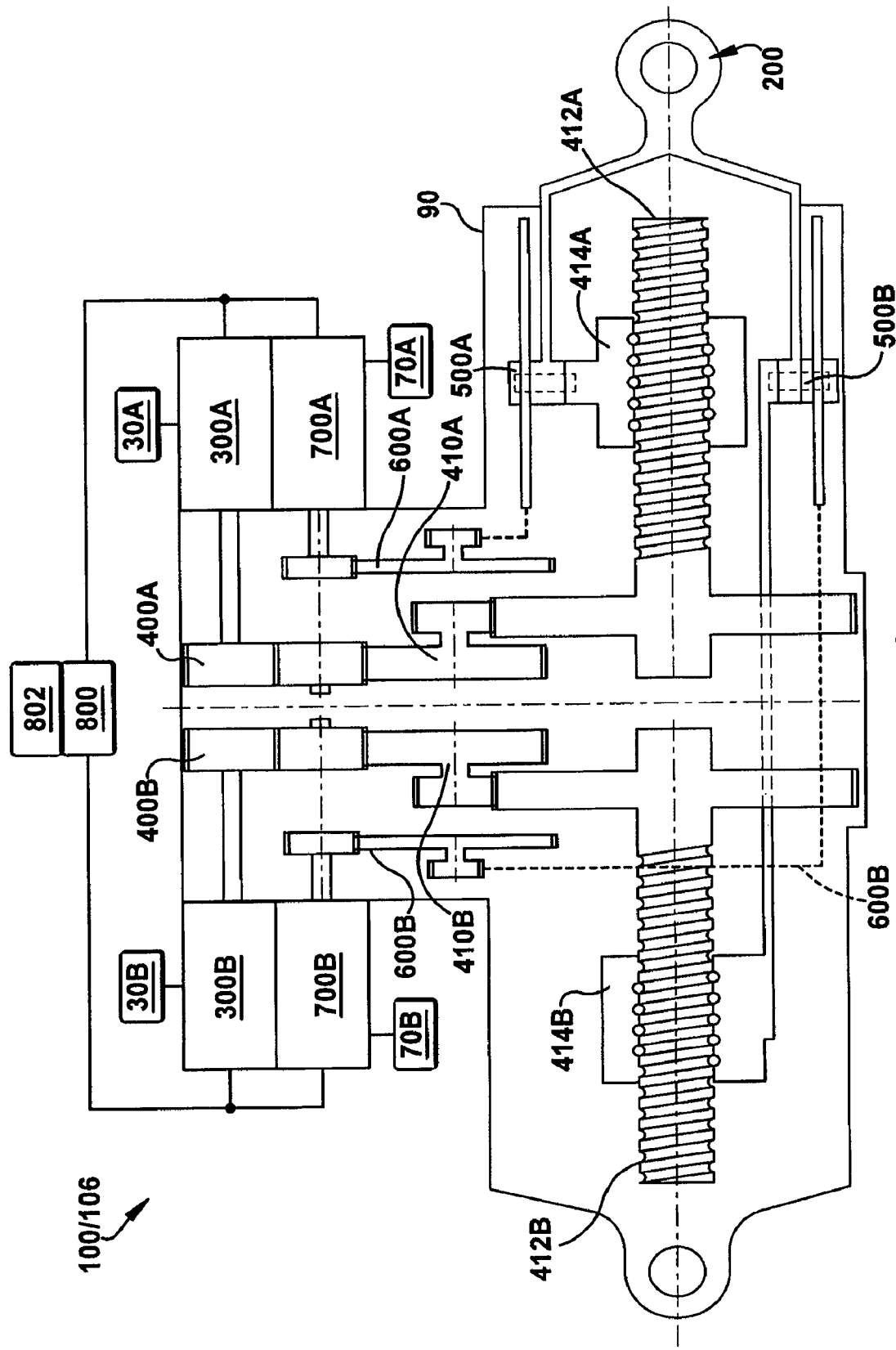
Figure 7:
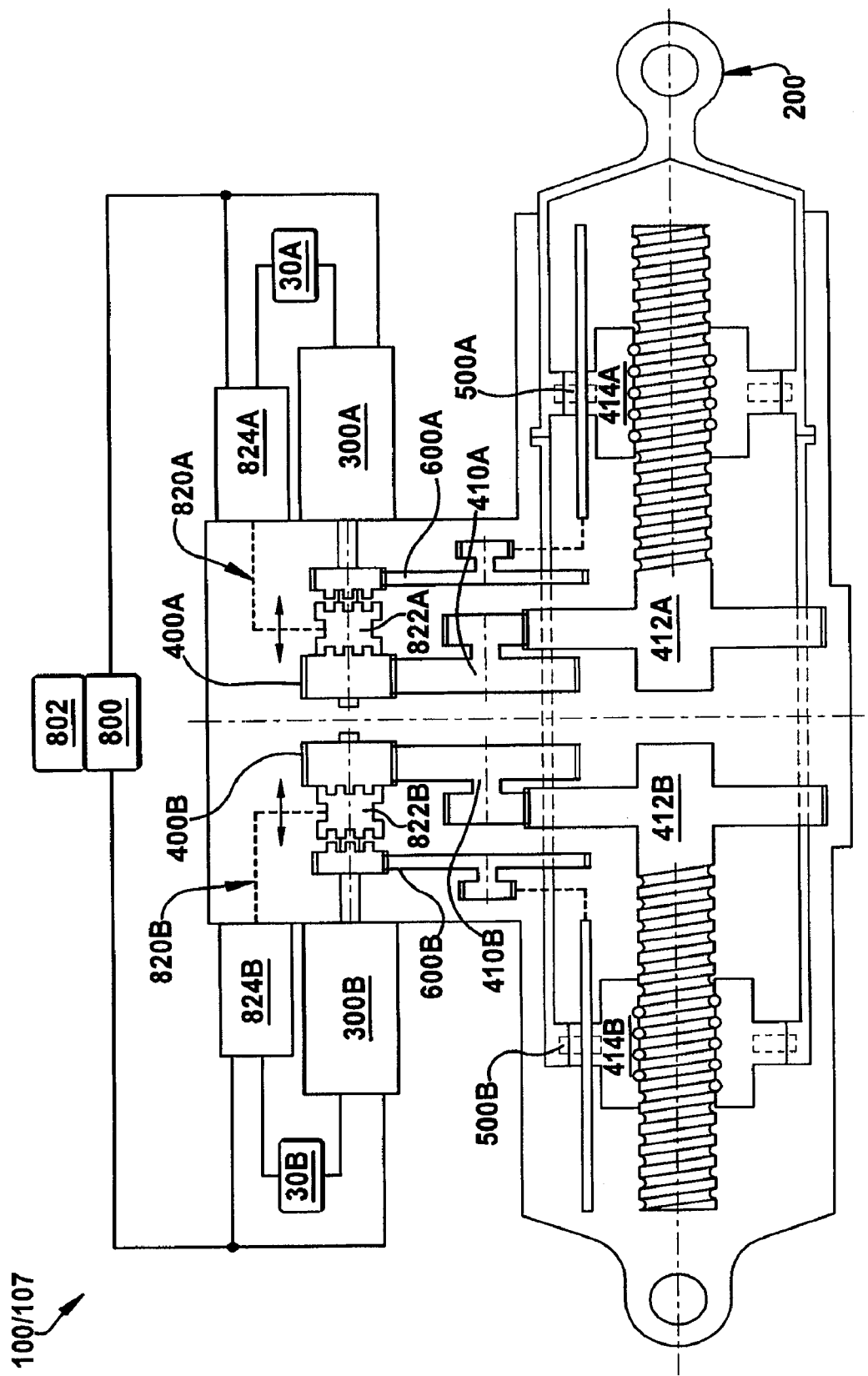
Figure 8:
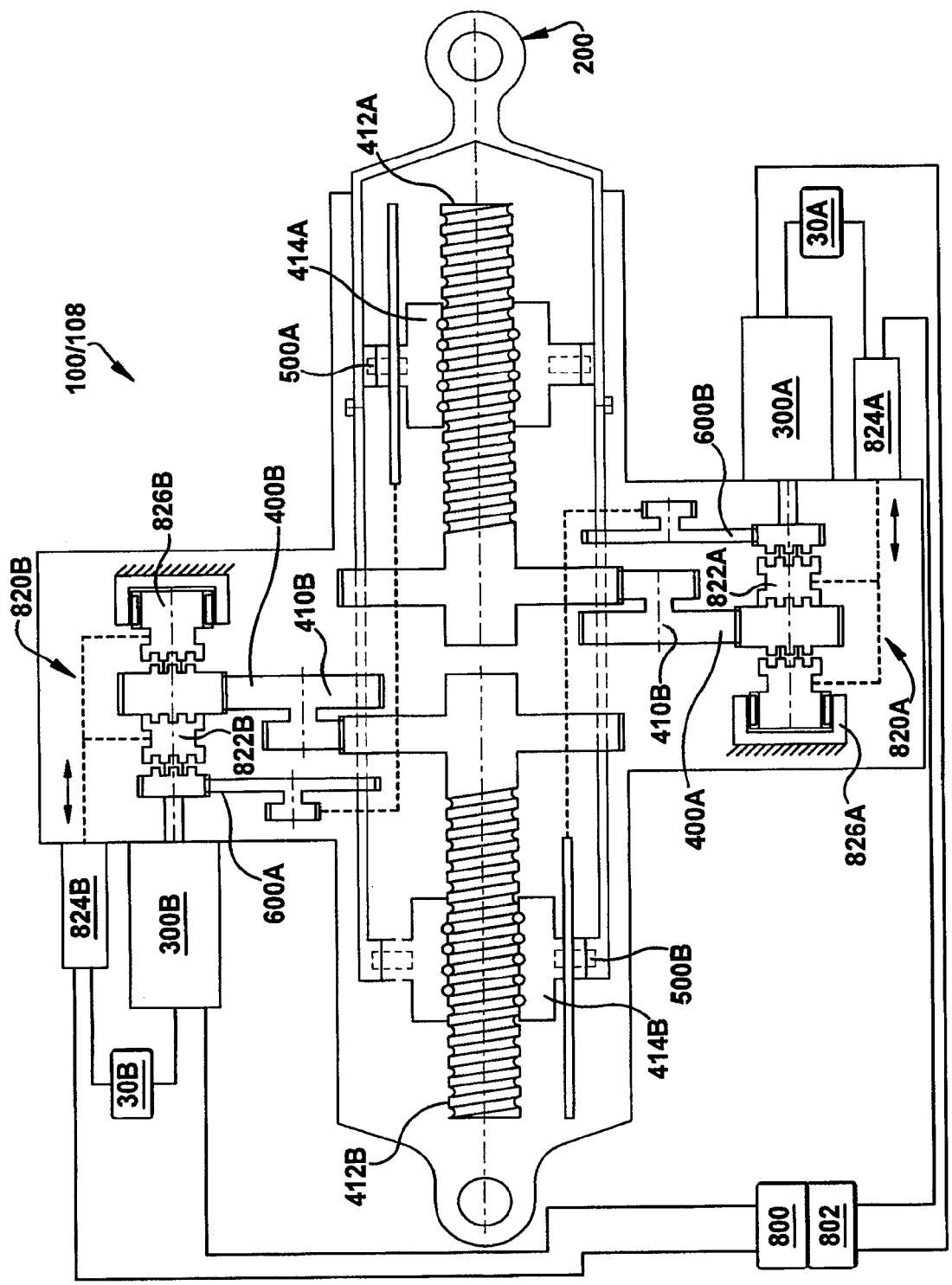
Figure 9:
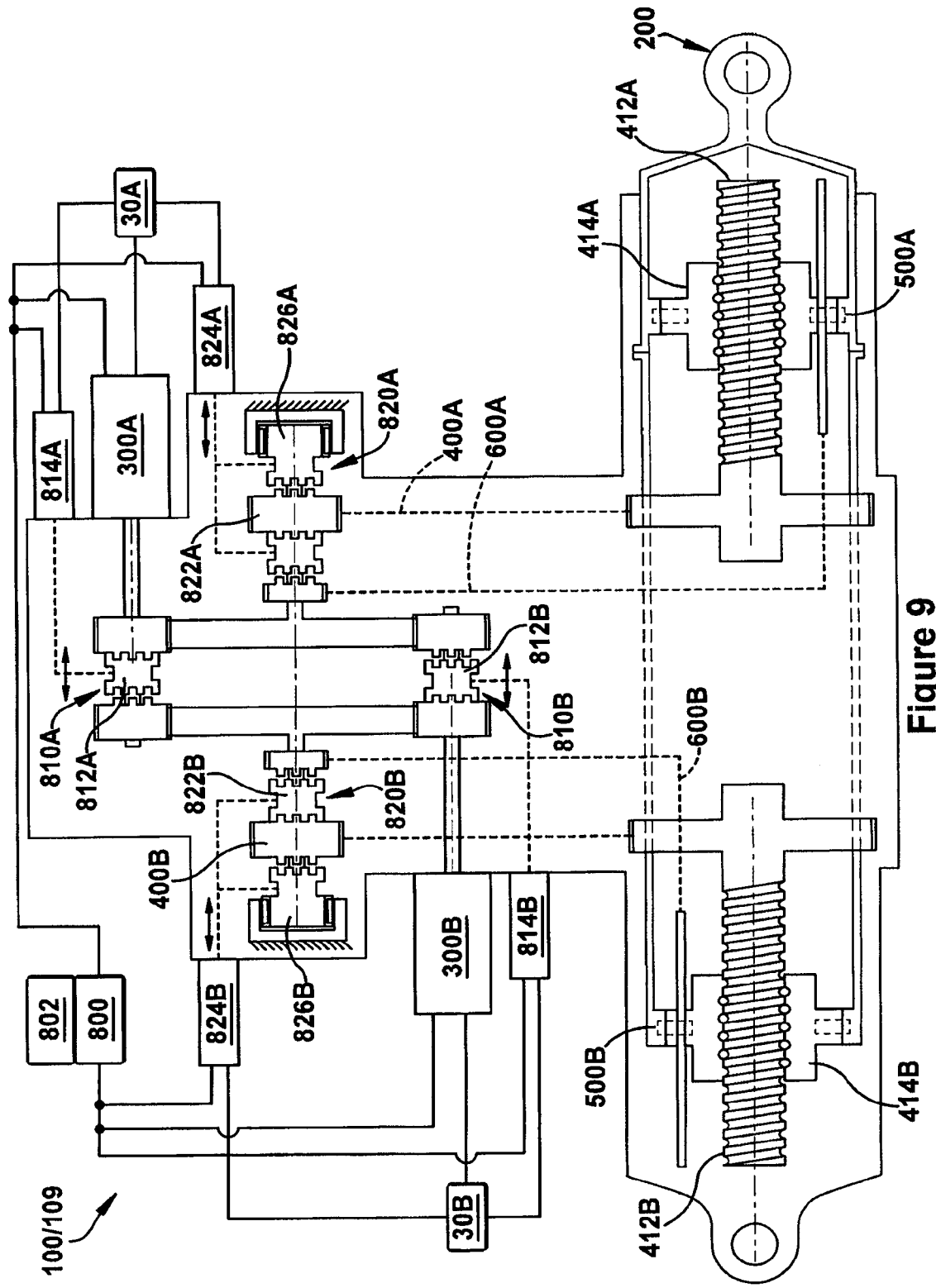
Figure 10:
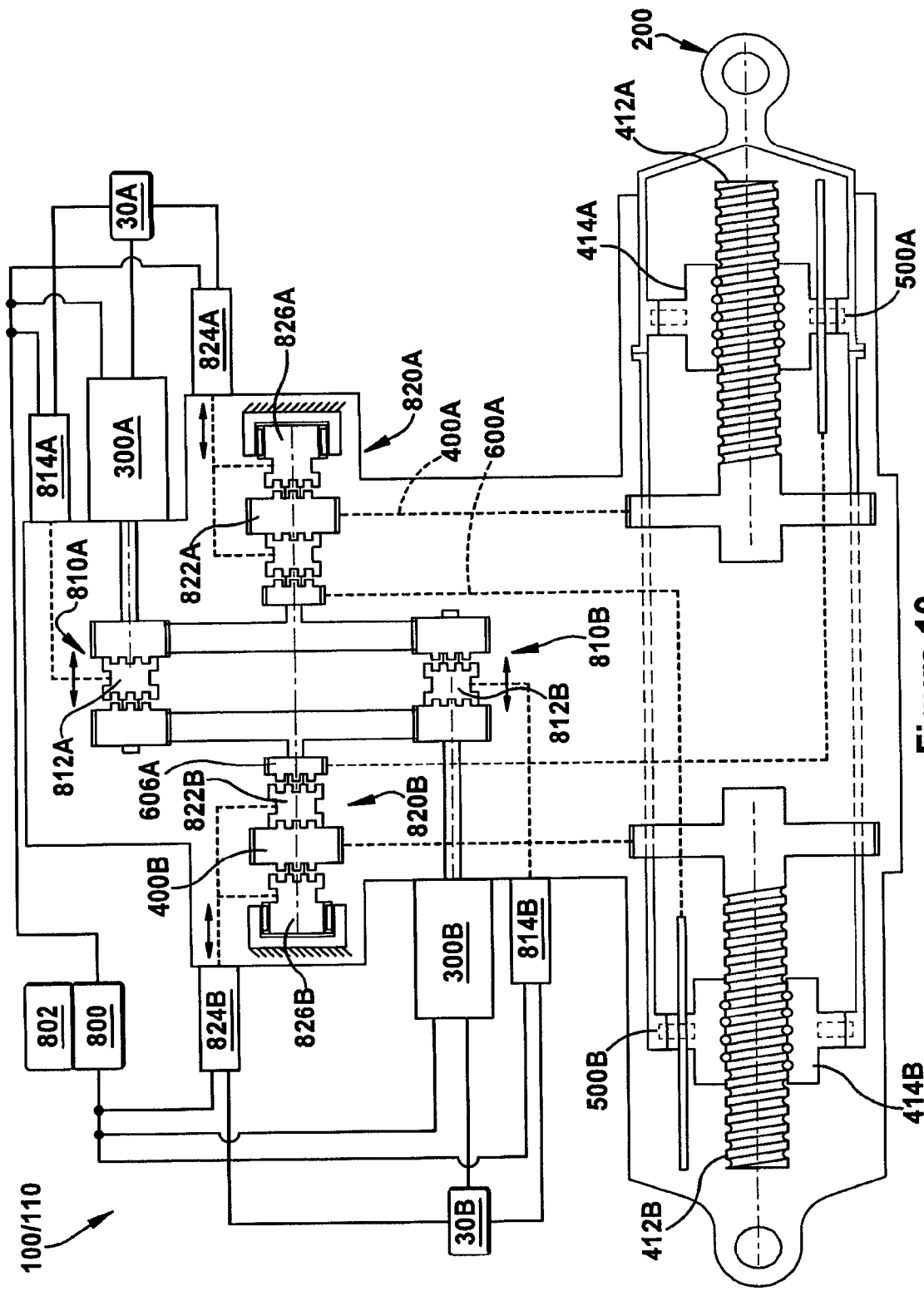
Figure 11:
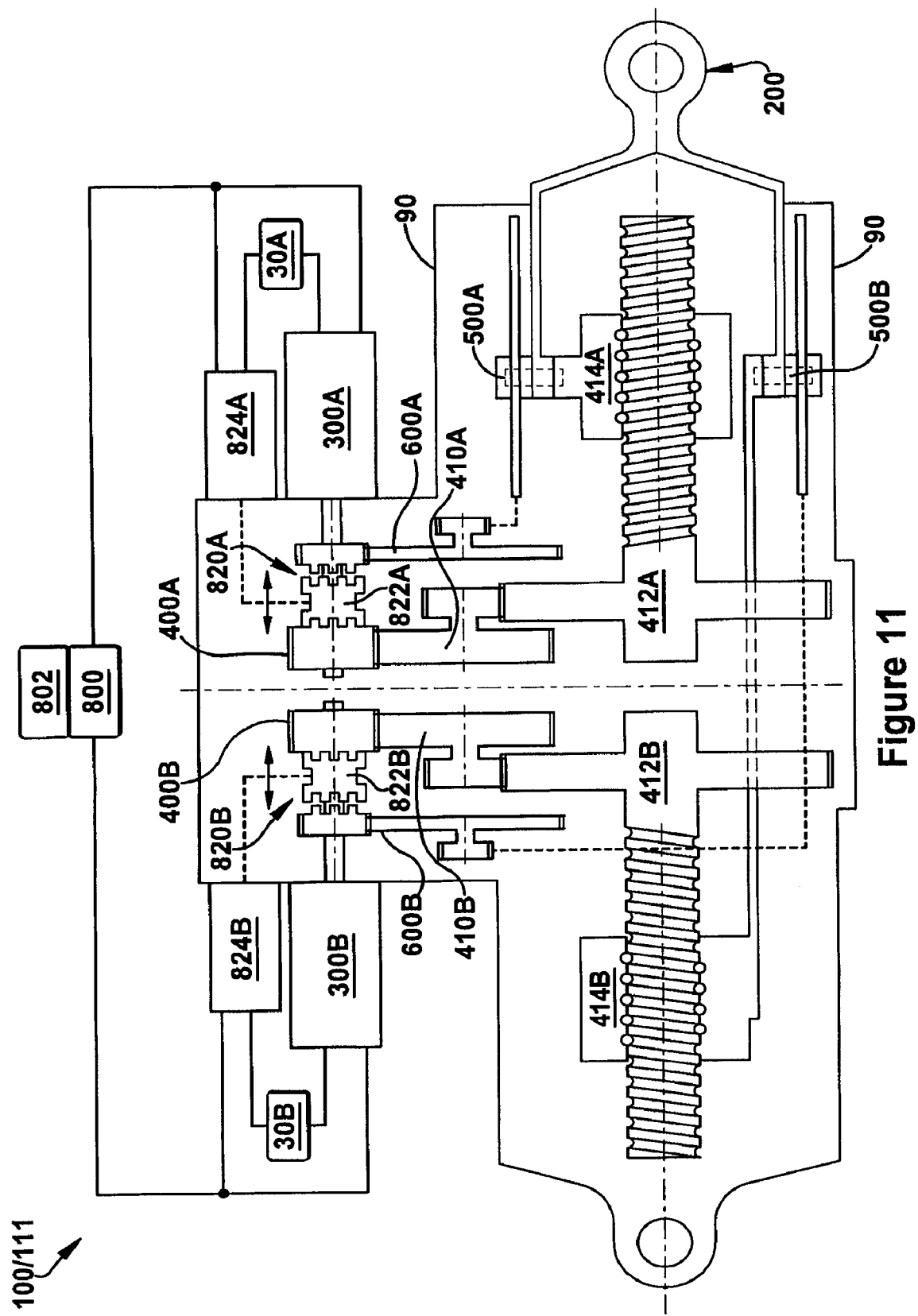

Referring now to the drawings, and initially to FIG. 1, an aircraft 10 is shown having flight-control-surface components 12 (e.g., stabilizers, rudders, elevators, flaps, ailerons, spoilers, slats, etc.) that are selectively moved during flight. As shown in FIGS. 2A-2C, an electromechanical actuating assembly 100 (i.e., an EMA assembly) is used to selectively move such a flight-control-surface component 12 among a plurality of positions.

Referring now to FIGS. 3-11, which diagram some of the many possible mechanical-electrical layouts. For ease in explanation, the various versions of EMA assemblies shown in these figures are collectively referred to as the EMA assembly 100. When describing a particular EMA assembly set forth in one of the FIG. 3, 4, 5, 6, 7, 8, 9, 10, or 11, it will be individually referred to as the EMA assembly 103, 104, 105, 106, 107, 108, 109, 110 or 111, respectively. (The trailing digits of the assembly's reference number corresponds to its figure sequence.)

The EMA assembly 100 comprises an actuator 200 having an output end for attachment to the component 12. The EMA assembly 100 also comprises a first motor 300A for providing actuator-moving power to the actuator 200, and a second motor 300B for providing actuator-moving power, independent of the first motor 300A, to the actuator. The motors 300A/300B can be powered by different electrical sources 30A and 30B, so that if one electrical source fails, only one motor 300A will be out of commission.

Thus, the EMA assembly 100 can have a redundant design whereby it is suitable for the aircraft components 12.

In the illustrated normal-operation modes, a first drivetrain 400A transfers actuating power from the first motor 300A to the actuator 200 and a second drivetrain 400B transfers actuating power from the second motor 300B to the actuator 200. The first drivetrain 400A (comprising a gear train 410A, a ballscrew 412A, and a ballnut 414A) is coupled to the actuator 200 via a first coupler 500A and the second drivetrain 400B (comprising a gear train 410B, a ballscrew 412B, and a ballnut 414B) is coupled to the actuator 200 via a second coupler 500B. Each coupler 500A/500B moves with the actuator 200 when it is coupled to the respective drivetrain 500A/500B.

The EMA assembly 100 further comprises a first decoupling train 600A for transmitting decoupling power to decouple the first drivetrain 400A from the actuator 200, and a second decoupling train 600B for transmitting decoupling power to decouple the second drivetrain 400B from the actuator 200. More specifically, the first decoupling train 600A decouples the first coupler 500A when decoupling power is transmitted therethrough. The second decoupling train 600B decouples the second coupler 500B when decoupling power is transmitted therethrough.

The decoupling trains 600A/600B and/or the couplers 500A/500B can be designed to remain connected to the actuator 200 throughout operation (and non-operation) of the EMA assembly 100. In the illustrated embodiment, for example, the decoupling trains 600A/600B are adapted to allow sliding of the couplers 500A/500B relative thereto. (See e.g., the linear couplers disclosed in co-owned U.S. Pat. No. 7,100,870.) The load inertia imposed by a decoupling train 600 will usually be minimal when compared to, for example, that imposed by a coupled drivetrain 400 and/or a back-driven motor 300.

The couplers 500A/500B can be repeatedly decoupled and recoupled (i.e., they can have reversible decoupling capability). But the recoupling of the couplers 500 need not occur while the aircraft 10 is in flight. In most fault situations requiring decoupling, the decoupled part 500 will remain decoupled for the duration of the flight. Thus, recoupling can be accomplished manually and/or without the participation of the decoupling trains 600. That being said, decoupling trains 600 which can also transmit recoupling power to recouple the couplers 500 (e.g., by driving the relevant means in reverse) are possible, contemplated, and may facilitate preflight testing. (See e.g., the rotary and liner couplers disclosed in co-owned U.S. Pat. No. 7,100,870.)

The EMA assembly 100 is operable in a plurality of fault-tolerant modes whereat it can accommodate at least the most probable fault situations. In the aircraft industry, the jamming of a drivetrain 400 (although itself unlikely) is often pegged as the most probable fault situation. Thus, the two most probable fault situations for the EMA assembly 100 would be a jam (or other malfunction) in the first drivetrain 400A or a jam (or other malfunction) in the second drivetrain 400B. In these two fault situations, both motors 300A and 300B are still contributing members of the assembly 100, as motor malfunction and motor unavailability are unlikely.

To this end, the EMA assembly 100 can further comprise a mode-conversion system 800 for converting from the normal-operation mode (whereat the first drivetrain 400A transfers actuating power from the first motor 300A and the second drivetrain 400B transfers actuating power from the second motor 300B) to the suitable fault-tolerant mode. The mode-conversion system 800 can incorporate or cooperate with a fault-detection system 802 that detects the occurrence of a fault situation. This detection can be accomplished, for example, by measuring and comparing input parameters (e.g., motor current, motor speed) and output parameters (e.g., actuator position, actuator velocity) to determine if a fault has occurred. (See e.g., the computer, the controller, and related items disclosed commonly owned U.S. Pat. No. 7,100,870.)

The EMA assembly is operable in at least two fault-tolerating modes so that it can survive the most probable fault situations (e.g., a single drive-train jam without motor malfunction). In one fault-tolerant mode, the M1D1-only mode, actuator-moving power is transferred only through the first drivetrain 400A and decoupling power transmitted through the second decoupling train decouples the second drivetrain 400B from the actuator 200. In another fault-tolerant mode, the M2D2 mode, actuator-moving power is transferred only through the second drivetrain 400B and decoupling power transmitted through the first decoupling train 600A decouples the first drivetrain 400A from the actuator 200.

If the mode-conversion system 800 and/or the fault-detection system 802 can simulate a failure occurrence, such simulation can be used during preflight testing to insure that the mode-conversion system 800 converts the assembly 100 to the appropriate fault-tolerant mode. When the couplers 500 have reversible decoupling capabilities, such testing can be efficiently accomplished. A preflight testing procedure can comprise, for example, simulating a jam in one of drivetrains 400 so that decoupling power is transmitted through the corresponding decoupling train 600B to place the assembly 100 in the M1D1-only mode (if the second drivetrain 400B is jammed) or the M2D2-only mode (if the first drivetrain 400A is jammed). After completion of testing (or a testing sequence), the decoupled-during-testing drivetrains 400 can be recoupled to the actuator 200. This recoupling can be efficiently accomplished by transmitting recoupling power through the decoupling trains 600 (if they have recoupling capacity).

As was indicated above, a single-drive-train jam (with no motor malfunction) would usually be considered the most probable fault situation for the EMA assembly 100. Single-motor-loss is usually viewed as more unlikely, but can create complications akin (and/or in addition) to a single-drive-train jam. This fault condition can occur when the electric supply from one of the power sources 30A/30B is interrupted, or when the motor 300A/300B malfunctions.

A single-motor-loss in combination with a single-drive-train jam is regarded as even less likely. This fault condition would be an intra-channel condition (e.g., loss of the first motor 300A and a jam in the first drivetrain 400A, or loss of the second motor 300B and a jam in the second drivetrain 400B) or a cross-channel condition (e.g., loss of the first motor 300A and a jam in the second drivetrain 400B, or a loss of the second motor 300B and a jam in the first drivetrain 400A). Intra-channel fault conditions are probably more common, because drivetrain jam can cause motor malfunctions, and/or motor malfunction can cause drivetrain jams.

Dual-drive-train jams are looked upon as unlikely occurrences in an aircraft application. Isolated train channels, wherein the drivetrains 400A and 400B do not intersect or interact with each other, can decrease the chance of dual drivetrain jams. With channel isolation, jam-causing debris from one drivetrain 400A/400B cannot as easily contaminate the other drivetrain 400B/400A. An isolation of the decoupling trains 600 may further anti-contamination objectives.

Fault situations wherein neither motor 300A/300B can transfer actuator-moving power to the actuator 200 are usually regarded as extremely rare. But dual-motor-loss situations can be particularly problematic. In many instances, the actuator movement will be at the mercy of external forces (e.g., airflow) on the component 12. This can result in sporadic flapping of the component 12, making it difficult to use other aircraft components to compensate.

Dual-motor-loss situation can occur when both motors 300 malfunction during flight. This is not an overly worrisome issue, especially with isolated channel arrangements. The situation where neither power source 30A/30B can supply electrical power, either by choice (because electrical power is being conserved for more critical components) or by casualty, dual-motor-loss is usually a more distinct possibility.

The EMA assembly 100 can be operable in a fault-tolerant mode that accommodates (or at least tolerates) situations wherein neither motor 300 can provide actuator-moving power. In this mode, the actuator 200 (and thus the component 12) is mechanically manipulated to allow compensation for its uncontrolled status. For example, the actuator 200 can be returned to a safe, passive, neutral or otherwise optimum position after loss of power (OPALOP) position. If the actuator 200 (and thus the component 12) is held in this position, compensation is more easily accomplished.

The EMA assembly 100 can preferably be automatically converted to the OPALOP mode upon loss of power, so that this conversion will occur even when electrical power is not available from either source 30. An alternate conversion by electrical or manual means may also be provided, so that the EMA assembly 100 is operable in this mode when the power sources 30 are up and running. The latter conversion means offers the option of holding the actuator 200 in the fixed condition upon detection of fault-condition (e.g., to reduce the risk of further jam-induced damage to the assembly 100).

Although not specifically shown in FIGS. 3-11, the EMA assembly 100 can incorporate OPALOP equipment for converting it into the OPALOP mode. As shown in FIGS. 12A-12F, this equipment can include a predisposition device 900 comprising an enabling mechanism 910 (including a solenoid 912 and a plunger 914) and a ratchet-and-pawl mechanism 920 (including ratchet 922 and pawls 926/928). The enabling mechanism 910 situates the ratchet-and-pawl mechanism 920 in a nonengagable posture during electrical operation (FIG. 12A) and in an engagable posture during nonelectrical operation (FIGS. 12B-12F).

Figure 12A:
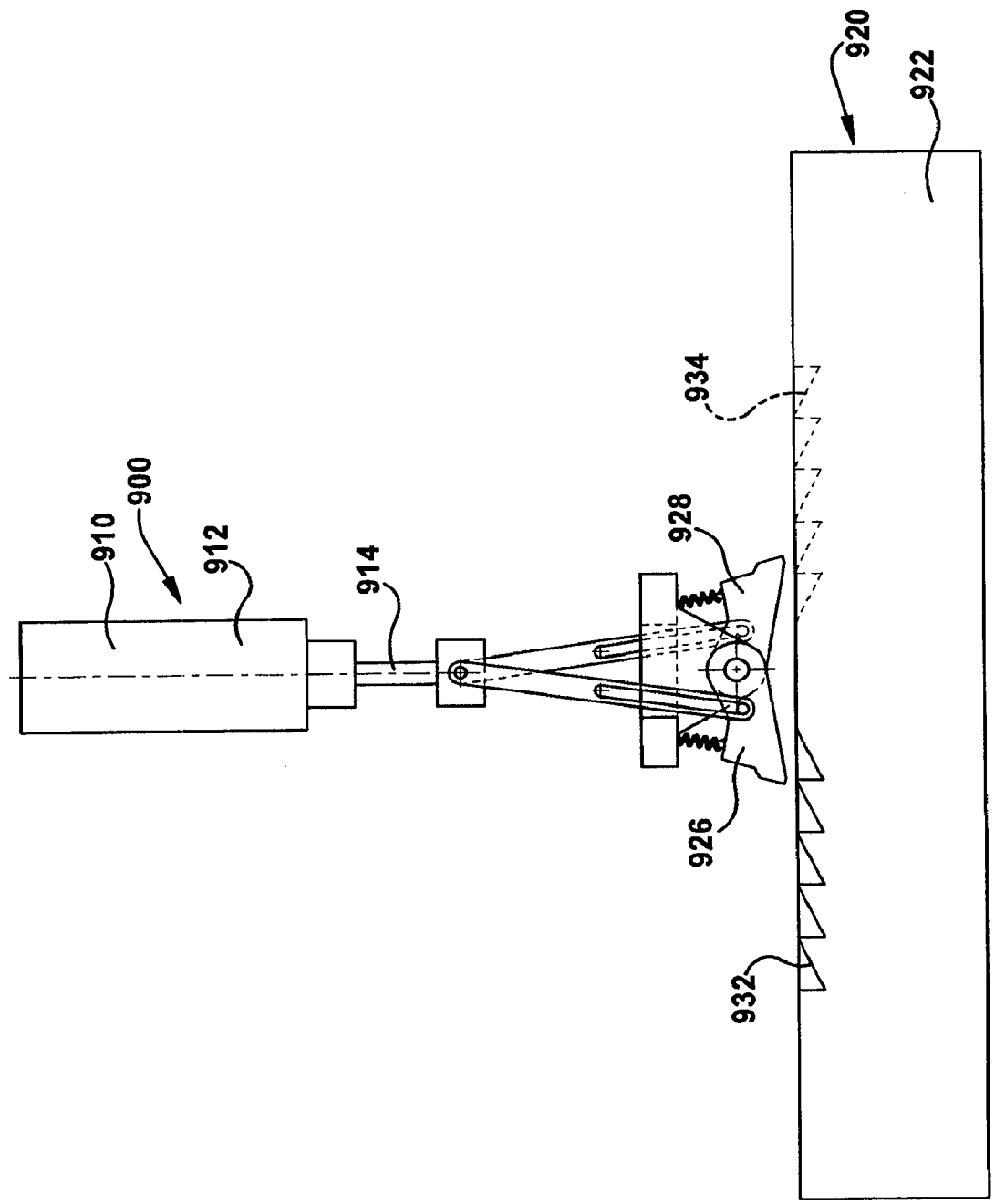
FIGS. 12A-12F are schematic drawings of a predisposition device for using in loss-of-power situations.
Figure 12B:
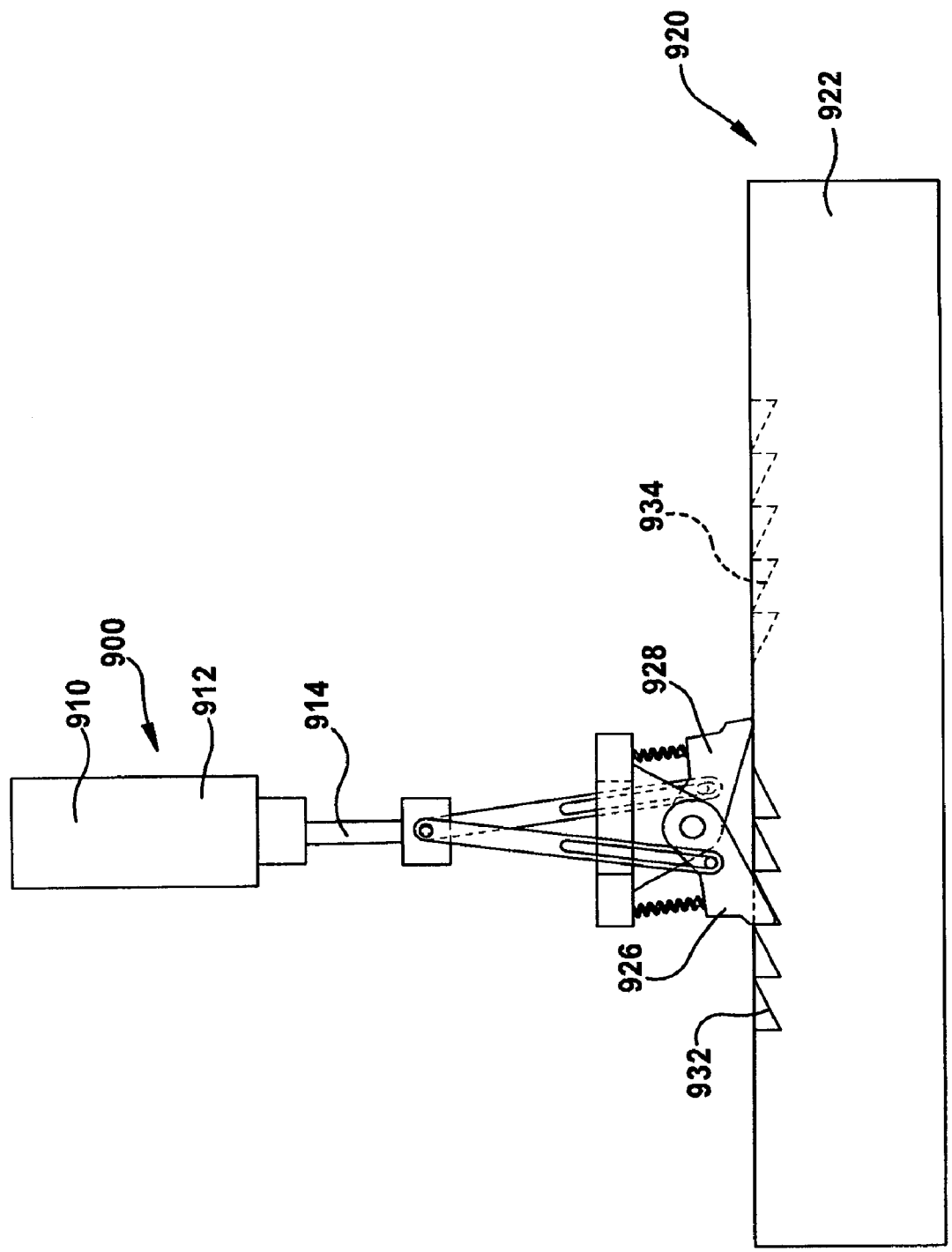
Figure 12C:
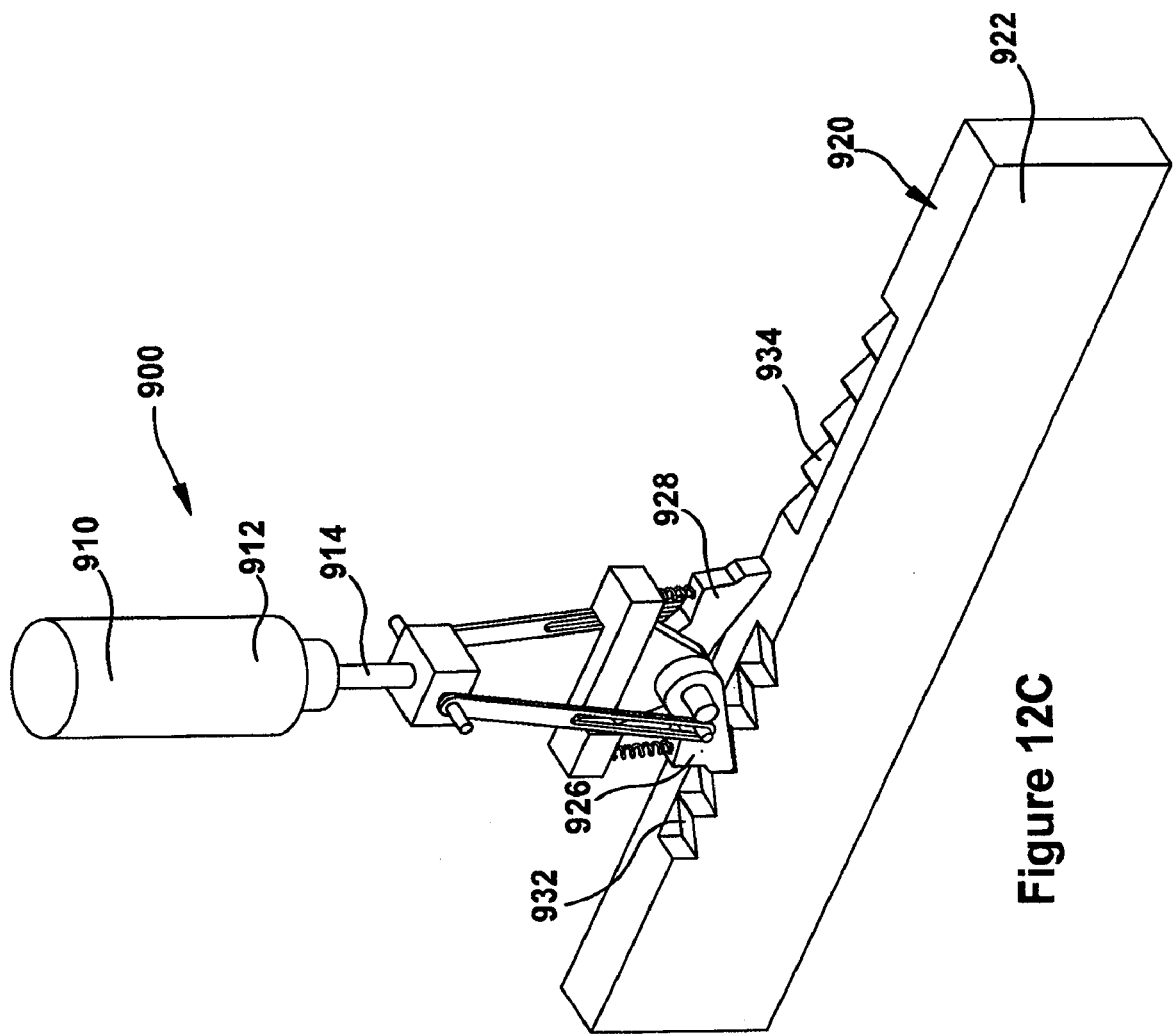
Figure 12D:
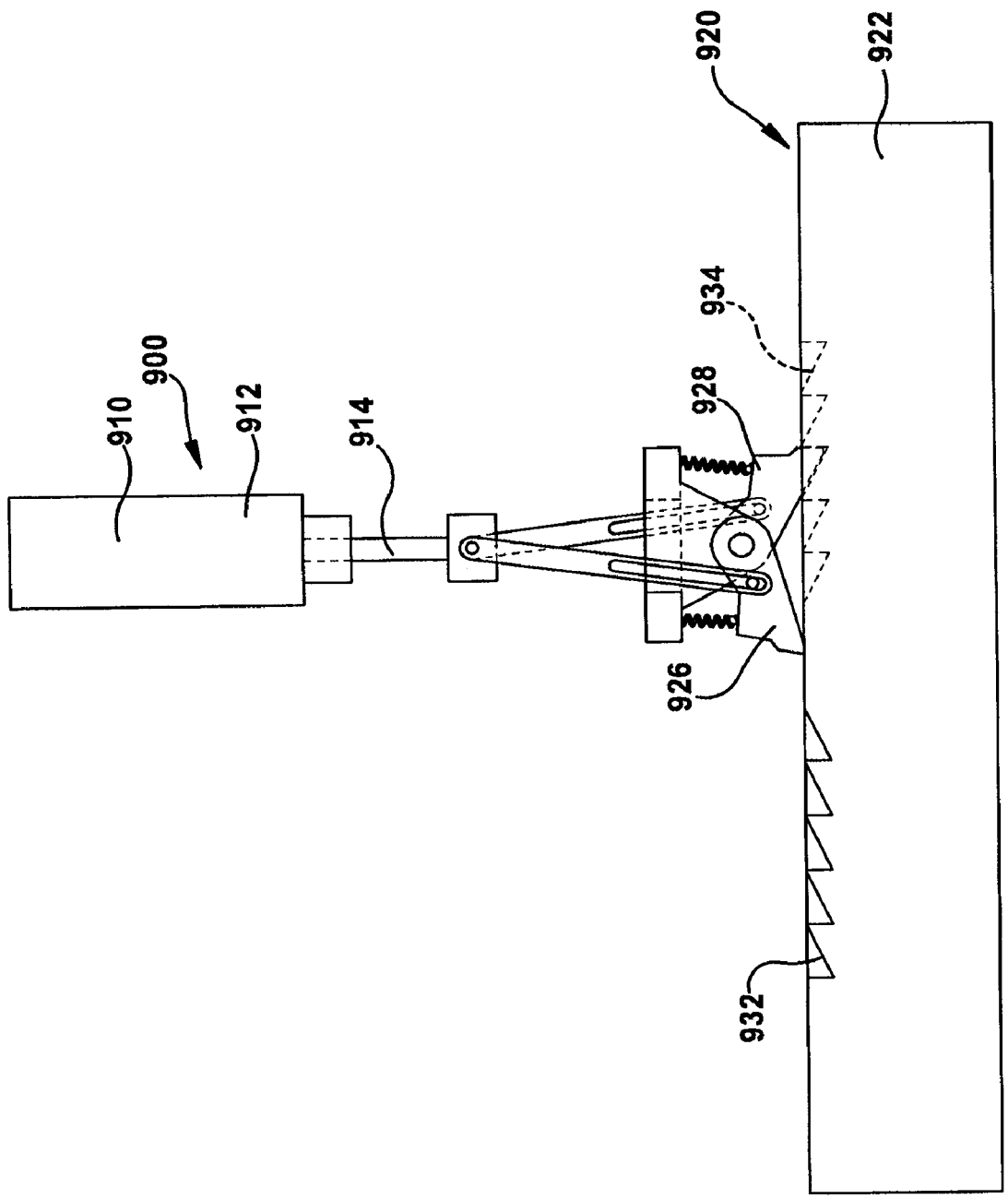
Figure 12E:
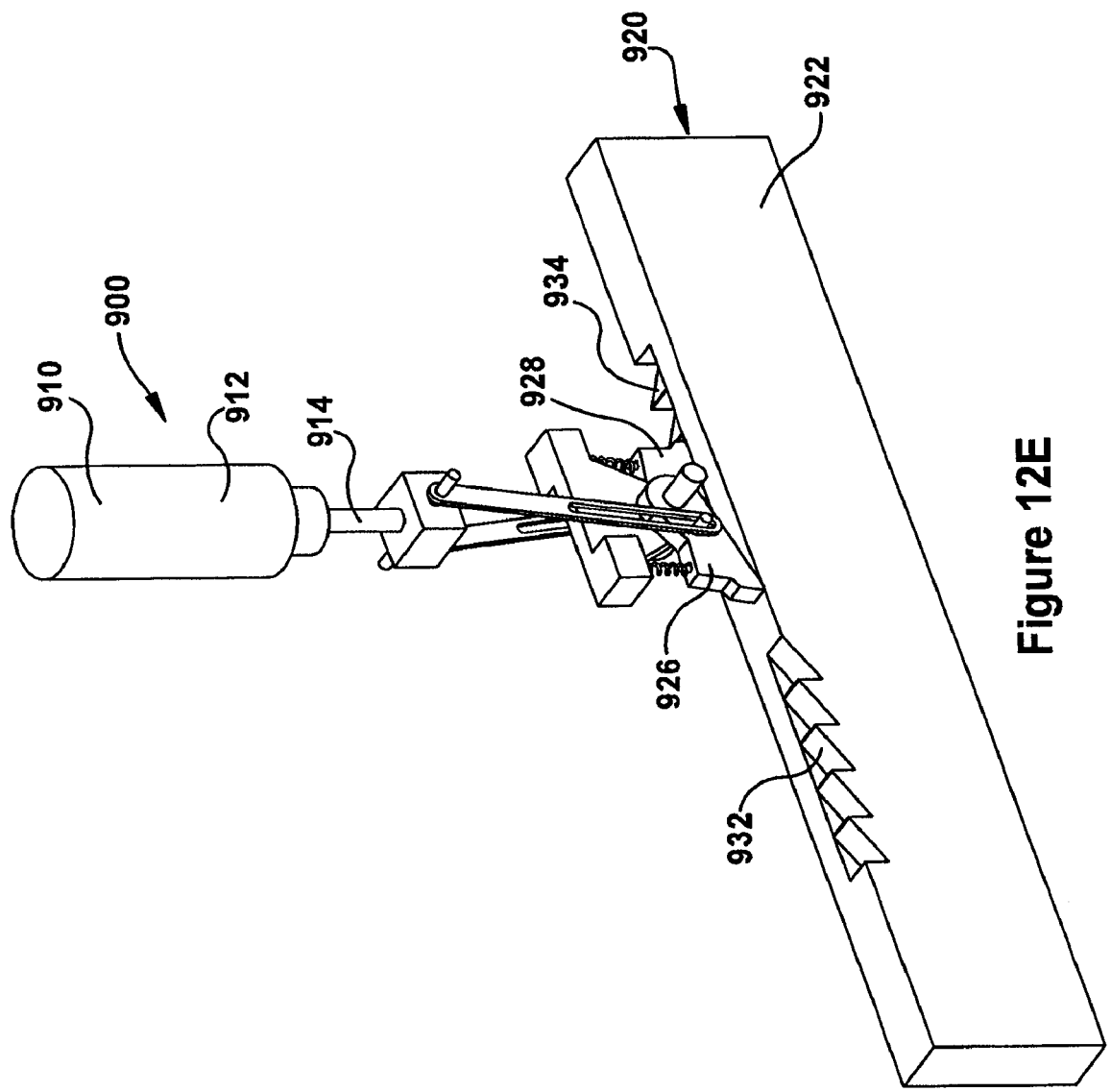

Depending upon the loss-of-power location of the actuator 200, the first pawl 926 is engagable with the first series of teeth 932 (FIGS. 12B and 12C) or the second pawl 928 is engagable with the second series of teeth 934 (FIGS. 12D and 12E). The non-engagable pawl rides an untoothed surface of the ratchet 922, but is laterally offset from the corresponding series of teeth 932/934. When an external force (e.g., air flow) on the component 12 is towards the OPALOP position, the engaged pawl 926/928 is pushed this way and slides over teeth 932/934. If an external force on the component 12 is away from the OPALOP position, the pawl 926/928 is caught in the engaged tooth 932/934 and the actuator 200 is prevented from moving in this direction.

Figure 12F:
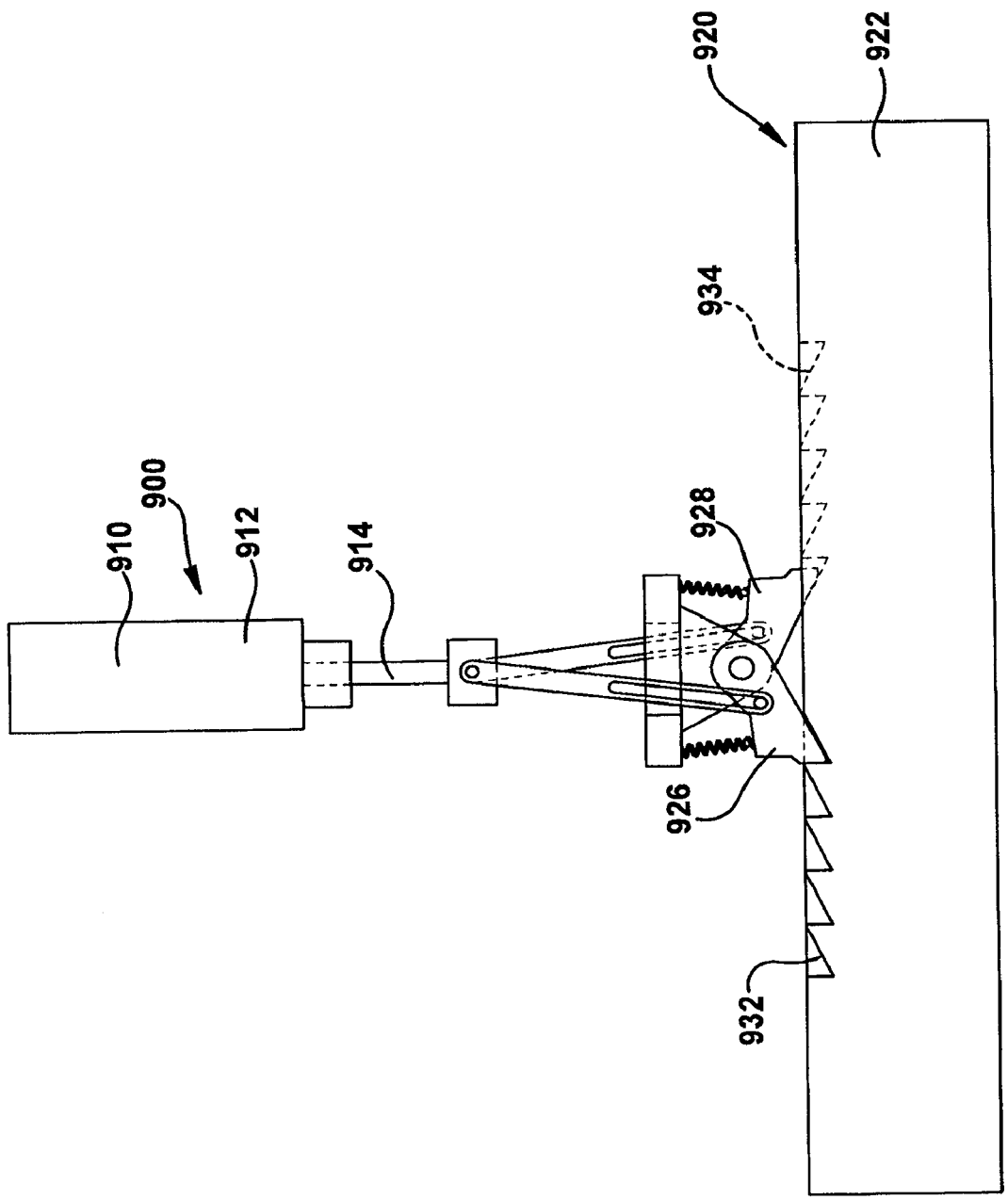

The actuator 200 can be located in the OPALOP position during nonelectrical operation. (FIG. 12F.) This can occur because, by happenstance, the actuator 200 was in this position at the end of electrical operation. Alternatively, the actuator 200 can be in OPALOP position during nonelectrical operation because of its ratchet movement in response to external forces on the component 12. In either or any event, the first pawl 926 can be engaged with the OPALOP-adjacent tooth 932 and the second pawl 928 can be engaged with the OPALOP-adjacent tooth 934. This two-pawl engagement locks the actuator 200 in the OPALOP position. (See e.g., the predisposition devices 900 disclosed in commonly owned International Application No. PCT/US07/77507 filed on Sep. 4, 2007).

In certain aircraft and/or in certain circumstances, undamped progression of the actuator 200 towards the OPALOP position may result in too-quick jerks and/or too-sudden shifts of the flight-control-surface component 12. Also, in some instances, it may be preferred that the component 12 hold its present and/or stepped positions for a short settling period, rather than immediately migrating towards the OPALOP position. In these cases, one or both the drivetrains 400 remaining connected to the motors 300 upon loss of power can desirably damp actuator movement. (The external force on the component 12 must be sufficient to backdrive the connected motor 300 to move the actuator 200.)

In other aircraft and/or in other circumstances, damping may not be necessary or desired (and may even be imprudent). If a predominant objective is prompt actuator return upon loss of power, a drivetrain disconnect may be necessary. A disconnect of the drivetrains 400A/400B from the motors 300A/300B may provide a timely response. Connection (or disconnection) of the decoupling trains 600A/600B will usually not have a significant effect in the OPALOP mode, especially if they are designed to translate with the actuator 200 during normal operation.

The EMA Assembly 103

FIG. 3

The EMA assembly 103 comprises dedicated decoupling motors 700A and 700B that provide the decoupling power for transmission through the decoupling trains 600A and 600B, respectively.

The decoupling motors 700A and 700B can be powered by different electrical sources 70A and 70B. The power source 70A can be the same as power source 30A and the power source 70B can be the same as power source 30B. But this arrangement may limit the fault-tolerance and/or the non-damped OPALOP-ability of the EMA assembly 103. If the motors 300A/300B and the motors 700A/700B are to be conjointly powered by only two sources, a source-crossover configuration may be best. In such a configuration, the first drive motor 300A and the second decoupling motor 700B are powered by one electrical source, and the second drive motor 300B and the first decoupling motor 700A are powered by the other electrical source.

Upon detection of a fault situation (e.g., by the fault-detection system 802), the mode-conversion system 800 activates the appropriate decoupling motor 700 to decouple the corresponding drive train 400. In the M1D1-only mode, the second decoupling motor 700B provides decoupling power, via the second decoupling train 600B, to decouple the second drive train 400B from the actuator 200. Upon this decoupling, actuator-moving power is provided by only the first motor 300A and is transferred only through the first drive train 400A. In the M2D2-only mode, the first decoupling motor 700A decouples the first drive train 400A (via the decoupling train 600A) and actuator-moving power is provided only by the second motor 300B through the second drive train 400B.

The EMA assembly 103 can also be able to accommodate fault situations wherein only one motor 300 is available to provide actuator-moving power (if the drive train 400 corresponding to this motor 300 is still functional). This assumes that the unavailability of the other motor 300 is unrelated to a power loss. Or, if power loss is the problem, this fault tolerance depends upon the needed decoupling motor 700 which is not powered by the same source as the unavailable motor 300. If the unavailable motor 300 and the needed decoupling motor 700 are powered by the same lost electrical source, decoupling of the inactive drive train 400 may not be possible. (This is why the source-crossover configuration may be best if the EMA assembly 103 only relies upon two power sources).

The EMA assembly 103 can also tolerate dual-motor malfunctions in the OPALOP mode. And this tolerance can selectively include undamped or damped OPALOP operation. If undamped operation is desired, the dedicated decoupling motors 700 can decouple one or both drive trains 400 regardless of drive motor malfunction. If damped operation is desired, such decoupling is not performed, the external force on the component 12 is required to backdrive the motors 300 for actuator movement. If the fault condition includes dual-motor malfunctions in combination with a jammed drive train 400 (or with two jammed drive trains 400A and 400B), undamped OPALOP operation may still be possible (although damped operation may not).

If the EMA assembly 103 suffers a total power loss (and both drive motors 300 are unavailable and both decoupling motors 700 are unavailable), decoupling of the drive trains 400 may not be possible. But the OPALOP mode can still proceed with back-drive damping, whereby the actuator 200 can eventually return to the predetermined optimum position.

Mode-conversion response time for the EMA assembly 103 can be relatively rapid due to the dedicated decoupling motors 700A and 700B. Also, the drive trains 400A and 400B are mechanically isolated from each other, the decoupling trains 600A and 600B are mechanically isolated from each other, and the drive trains 400 are mechanically isolated from the decoupling trains 700. This isolation greatly reduces the risk of a debris jam in one train 400/600 contaminating another train.

The EMA Assembly 104

FIG. 4

The EMA assembly 104 is similar to the EMA assembly 103 (in that it has dedicated decoupling motors 700A and 700B) and further comprises converters 810A and 810B for conversion to a drivetrain-crossover configuration.

The drivetrain-crossover converters 810A/810B are each convertible between a first condition and a second condition. When the first converter 810A is in its first condition, the first motor 300A is drivingly connected to the first drive train 400A. When the first converter 810A in its second condition, the first motor 300A is drivingly connected to the second drive train 400B. When the second converter 810B is in its second condition, the second motor 300B is drivingly connected to the second drive train 400B. When the second converter 810B is in its first condition, the second motor 300B is drivingly connected to the first drive train 400A.

During normal operation, the first converter 810A is in its first condition (whereby the first motor 300A drives the first drivetrain 400A) and the second converter 810B is in its second condition (whereby the second motor 300B drives the second drivetrain 400B.) The converters 810A/810B can each comprise a clutch 812A/812B and a solenoid switch 814A/814B for shifting the clutches 812A/812B. The solenoid switches 814A/814B are deenergized during normal operation, and are energized (i.e., electricity must be provided) to convert to a drivetrain-crossover configuration.

In the M1D1-only mode, the first converter 810A is in its first condition whereby the first motor 300A drives the first drivetrain 400A. The second converter 810B is in its second condition, whereby the second drivetrain 400B is connected to the second motor 300B. But the second decoupling motor 700B decouples the second drivetrain 400B from the actuator 200, whereby actuator-moving power is provided only by the first motor 300A and transmitted only through the first drivetrain 400A.

In the M2D2-only mode, the second converter 810B is in its second condition, whereby the second motor 300B drives the second drivetrain 400B. The first converter 810A is in its first condition, whereby the first drivetrain 400A is connected to the first motor 300A, but is decoupled from the actuator 200 via the decoupling motor 700A. Actuator-moving power is provided only by the second motor 300B and is transmitted only through the second drivetrain 400B.

The EMA assembly 104 is also operable in a M1D2-only mode and a M2D1-only mode. In the M1D2-only mode, the first converter 810A is in its second condition and the second converter 810B is in its first condition. The first motor 300A is drivingly connected to the second drivetrain 400B, and the first drive train 400A is decoupled from the actuator 200 (via the first decoupling motor 700A). Actuator-moving power is provided only by the first motor 300A and is transmitted only through the second drivetrain 400B.

In the M2D1-only mode, the first converter 810A is again its second condition and the second converter 810B is again in its first condition. But the second drivetrain 400B is decoupled from the actuator 200 (via the second decoupling motor 700B). The second motor 300B is drivingly connected to the first drive train 400A, and actuator-moving power is provided only by the second motor 300B and is transmitted only through the first drivetrain 400A.

The EMA assembly 104 can accommodate the same fault situations as the EMA assembly 103 in its M1D1 mode and its M2D2 mode. And the EMA assembly 104 can accommodate further fault situations in its M1D2 mode and its M2D1 mode. Particularly, the assembly 104 can accommodate fault situations wherein only one motor 300 is operative and its corresponding drive train 400 is jammed (e.g., active first motor 300A, inactive second motor 300B, and jammed first drivetrain 400A; or inactive first motor 300A, active second motor 300B, and jammed second drivetrain 400B). This extra accommodation may come at the expense of less train-isolation, as the drivetrains 400 have a clutch interface in most modes of operation, and will interact in the M1D2-only mode and the M2D1-only mode.

The EMA assembly 104 can also tolerate dual-motor malfunctions in the OPALOP mode (with the option of undamped or damped OPALOP operation in non-jammed situations). In a loss-of-power situation, undamped operation of the EMA assembly 104 may not be possible. If the decoupling motors 700 are down, there is no way to decouple the drivetrains 400 from the actuator 200, and they will remain connected to the motors 300.

The EMA Assembly 105

FIG. 5

The EMA assembly 105 is similar to the EMA assembly 104 (with dedicated decoupling motors 700 and converters 810 for drivetrain-crossover conversion), but it allows undamped (but not damped) OPALOP operation during a power loss.

In the EMA assembly 105, the converters 810A/810B are each convertible among three conditions, namely a first condition, a second condition, and a dual-disconnect condition. The solenoids 814A/814B are energized in the first condition and are energized in the second conditions, and to thereby shift the clutches 812A/812B between engagement with the first motor 300A and the second motor 300B, respectively. The solenoids 814A/814B are deenergized in the dual-disconnect condition, the clutches 812A/812B do not engage either motor 300A/300B.

In a loss-of-power situation, the decoupling motors 700 will be down. And, as in the EMA assembly 104, there is no way to decouple the drivetrains 400 from the actuator 200. But upon loss-of-power, the solenoids 814A/814B will be deenergized, thereby disconnecting the drivetrains 400 from the motors 300. Thus, backdriving of the motors 300 would not be necessary to move the actuator 200 during OPALOP operation.

The EMA Assembly 106

FIG. 6

The EMA assembly 106 can be the same as or similar to the EMA assembly 103, and operated in the same manner. But in the EMA assembly 106, both couplers 500A and 500B are concentrated in one area of the assembly and this area is surrounded by a ballistic shield 90.

In the EMA assembly 103, the couplers 500A and 500B are remotely located relative to one another. The coupler 500A is located adjacent the first ballscrew 412A and ballnut 414A, and the second coupler 500B is located adjacent the second ballscrew 412B and ballnut 414B. The same is true with couplers 500 in the EMA assembly 104 and the EMA assembly 105.

Statistics show certain fault situations (e.g., single-drivetrain jams) are most probable and other fault situations (e.g., multiple injuries in the same motor-train channel) are very rare. But severe environmental episodes and/or offensive military attacks can dramatically change the odds, and the chance of entire assemblies being damaged or destroyed may have to be considered. If natural and/or combative assaults are expected for the aircraft 10, crucial elements can be ballistically enclosed for protection during flight. However, the shielding provided by such heavy armor must be balanced against the aircraft's weight constraints. Surrounding an entire EMA assembly may not be possible in many instances.

In the illustrated EMA assembly 106, the second coupler 500B is connected to the second ballscrew 412B via a relatively long rod and located adjacent the first ballscrew 412A and ballnut 414A. If the aircraft 10 encounters hostility during flight, the ballistic shield 900 protects both couplers 500A and 500B. If crucial parts of the second drive train 400B (e.g., the gear train 410B, the ballscrew 412B, and/or the ballnut 414B) are damaged by the onslaught, the decoupling motor 700B can still decouple the damaged drive train 400B from the actuator 200. (Although FIG. 6 may schematically imply that the decoupling train 600B passes through the same unprotected area as the trailing parts of the second drive train 400B, this is not necessarily the case. The decoupling train 600B could instead follow a more protected path similar to that of the first decoupling train 600A.)

The couplers 500 of the EMA assembly 104 and/or the EMA assembly 105 could placed in a similar arrangement for ballistic shielding or other purposes.

The EMA Assembly 107

FIG. 7

In the EMA assembly 107, the drive motors 300A and 300B provide drive power for the respective drive trains 400A and 400B and also provide decoupling power for the respective decoupling trains 600A and 600B. Thus, unlike the EMA assemblies 103-106, the EMA assembly 107 does not require the aircraft 10 (or other vehicle) to indulge the weight of four separate motors.

The mode-conversion system 800 includes a first drive-decouple converter 820A (comprising a clutch 822A and a solenoid switch 824A) and a second drive-decouple converter 820B (comprising a clutch 822B and a solenoid switch 824B) are used to convert the EMA assembly 107 from the normal-operation mode to a fault-tolerant mode. The converters 820A/820B each converts between a drive condition (illustrated) and a decouple condition.

When the first drive-decouple converter 820A is in its drive condition, the first motor 300A is drivingly connected to the first drive train 400A by the clutch 822A. In its decouple condition, clutch 822A shifts to drivingly connect the first motor 300A to the first decoupling train 600A. Likewise, the clutch 822B drivingly connects the second motor 300B and the second drive train 400B when the converter 820B is in its drive condition, and the clutch 822B drivingly connects the second motor 300B and the second decoupling train 600B when the converter 820B is in its decouple condition.

The first solenoid switch 824A motivates movement of the first clutch 822A and the second solenoid switch 824B motivates movement of the second clutch 822B. The solenoid 824A/824B can be energized in the drive condition and deenergized in the decouple condition. During normal operation, both converters 820A and 820B are in the drive condition, whereby the solenoids 824A/824B are energized throughout normal operation.

When the EMA assembly 107 is in the M1D1-only mode, the converter 820A is in its drive condition and the converter 820B is in its decouple condition. Actuator-moving power is provided by only the first motor 300A and is transferred only through the first drive train 400A. Decoupling power provided by the second motor 300B is transferred through the second decoupling train 600B whereby the second drive train 400B is decoupled from the actuator 200. In the M2D2-only mode, the converter 820A is in its decouple condition and the converter 820B is in its drive condition. Actuator-moving power is provided by only the second motor 300B and is transferred only through the second drive train 400B. Decoupling power provided by the first motor 300A is transferred through the first decoupling train 600A whereby the first drive train 400A is decoupled from the actuator 200.

The EMA assembly 107 can accommodate the most probable fault situations (i.e., single-drive-jam with no motor malfunction) in its M1D1-only mode and its M2D2-only mode. The EMA assembly 107 may also be able to tolerate fault situations wherein only one motor 300 is available to provide actuator-moving power (if the drive train 400 corresponding to this motor 300 is still functional). It may not be adapted to gracefully tolerate a fault situation wherein the motor 300A is unavailable and the drive train 400A should be decoupled, or a fault situation wherein the motor 300B is unavailable and the drive train 400B should be decoupled. The EMA assembly 107 may also not be particularly forgiving when the drivetrain 400 of the only active motor 300 is jammed. However, because the drivetrains 400A and 400B in the EMA assembly 107 are mechanically isolated from each other, the risk of less-probable faults may be essentially nonexistent in most aircraft applications.

In a loss-of-power situation, the solenoids 824A and 824B will be deengerized and thus the clutches 822A and 822B automatically shifted to their decouple conditions. This will disconnect the drivetrains 400 from the motors 300 for undamped OPALOP operation.

The EMA Assembly 108

FIG. 8

The EMA assembly 108 is similar to the EMA assembly 107 in that its drive motors 300 also provide the decoupling power. The EMA assembly 108 also has a decoupling crossover configuration so that the active motor 300A/300B can provide decoupling power to decouple the drivetrain 400B/400A of the inactive motor 300B/300A.

In the drive-decouple converters 820A/820B of the EMA assembly 108, the solenoid 824A/824B can be deenergized in the drive condition and energized in the decouple condition. Thus, during normal operation, when both converters 820A and 820B are in the drive condition, the solenoids 824A/824B are deenergized (thereby having a reduced energy draw, generating less heat, and allowing a smaller solenoid size than the energized-during-normal-operation solenoids 824 of the EMA assembly 107). Each converter 820A/820B further comprises an actuator-position lock 826A/826B that can be automatically activated by the clutch 822A/822B in the decouple condition.

When the EMA assembly 108 is in its M1D1-only mode, the converter 820A temporarily leaves its drive condition to be in its decouple condition to decouple the second drive train 400B from the actuator 200. The lock 826A holds the actuator 200 in place during this decoupling (otherwise the actuator 200 is at the mercy of external forces on the component 12). The converter 820A then returns to the drive condition and actuator-moving power is provided by only the first motor 300A (and is transferred only through the first drive train 400A). In the M2D2-only mode, converter 820B similarly does a drive-decouple-drive shift to decouple the first drive train 400A, and the actuator 200 is held in place during decoupling by the lock 826B.

The EMA assembly 108 can tolerate fault situations wherein only one motor 300A/300B, and its corresponding drive train 400A/400B, remain operative. The motor 300 of the active channel (rather than the inactive channel as in the EMA assembly 104) provides the decoupling power. This arrangement may be beneficial if a jam in a drivetrain 400 is likely to cause problems in the corresponding motor 300 or vice-a-versa. However, unlike the EMA assembly 107 (and also unlike the EMA assemblies 103-106), the EMA assembly 108 requires a temporary lapse in actuator-driving during the decoupling step. If the component 12 is in the midst of a critical maneuver, decoupling may have to be delayed until a more opportune time.

In a loss-of-power situation, the solenoids 824A/824B will remain deenergized and thus the clutches 822A/822B will maintain the connection between the motors 300A/300B and the drivetrains 400A/400B. Thus, the EMA assembly 108 is probably only capable of damped OPALOP operation.

The EMA Assembly 109

FIG. 9

The EMA assembly 109, like the EMA assembly 107, has drive motors 300 that also provide the decoupling power and corresponding drive-decouple converters 820. The EMA assembly 109, like the EMA assembly 105, has converters 810A and 810B for drivetrain-crossover conversion.

In the normal-operation mode, the first motor-path converter 810A is in its first condition and the first drive-decouple converter 820A is in its drive condition. The second motor-path converter 810B is in its second condition, and the second drive-decouple converter 820B is in its drive condition. The first motor 300A transfers actuator-moving power through the first drivetrain 400A and the second motor 300B transfers actuator-moving power through the second drivetrain 400B.

If the fault-condition consists of a jam in the second drivetrain 400B (without malfunction of the second motor 300B), the first motor-path converter 810A remains in its first condition and the first drive-decouple converter 820A remains in its drive condition. The second drive-decouple converter 820B is shifted to its decouple condition, and decoupling power is transmitted through the second decoupling train to decouple the second drivetrain 400B from the actuator 200. This converts the EMA assembly 109 to its M1D1-only mode. A similar sequence is followed if the fault-condition consists of a jam in the first drivetrain 400A (without malfunction of the first motor 300A), and the EMA assembly 109 is converted to the M2D2-only mode.

If the fault-condition involves a malfunction of the second motor 300B (with or without a jam of the second 400B), the sequence can become a bit more complex. The first motor-path converter 810A is shifted to the second condition and the second drive-decouple converter 820B is shifted to the decouple condition. The first motor 300A can then transmit decoupling power through the second decoupling train 600B to decouple the second drivetrain 400B from the actuator 200. The first motor-path converter 810A is then returned to the first condition and the second drive-decouple converter 820B is returned to the drive condition (even though it has nothing to drive). This converts the EMA assembly 109 to the M1D1-only mode wherein only the first motor 300A provides actuating power that is transmitted only through the first drivetrain 400A. Analogous steps are performed to accommodate a malfunction of the first motor 300A and to convert the EMA assembly 109 to the M2D2-only mode.

The EMA assembly 109, like the EMA assembly 105, is operable in a M1D2-only mode and a M2D1-only mode. To convert the assembly 109 to the M1D2-only mode, the first drive-decouple converter 820A is shifted to the decouple condition so that the first motor 300A can transmit decoupling power through the first decoupling train 600A to decouple the first drivetrain 400A. The first drive-decouple converter 820A is then shifted back to the drive condition, and the first motor-path converter 810A is shifted to the second condition. (The second drive-decouple converter 820B should still be in the drive condition.) The first motor 300A then transfers actuator-moving power through the second drive train 400B. The same scenario is adopted to convert the EMA assembly to the M2D1-only mode.

When the drive-decouple converters 820 are in their decouple conditions, the corresponding actuator-position locks 826 are automatically activated to hold the actuator 200 stationary. In some fault situations (e.g., a single-drive train jam without motor malfunction), locking is not necessary as the actuator 200 would still be driven by the other motor 300. But in some fault situations (e.g., only one active motor), decoupling will require a temporary suspension of actuator-moving power, whereby such locking may be prudent to avoid uncontrollable flapping of the component 12. In the M1D1-only mode, the M2D2-only mode, the M1D2-only mode, and the M2D1-only mode, the drive-decouple converter 820 of the inactive motor 300 remains in the drive condition. This insures release of the actuator-position locks 826 to minimize the inertia load on the active motor 300.

The solenoid switches 814 of the motor-path converters 810 are energized in the first conditions, are energized in the second conditions, and are deenergized in a dual-disconnect condition. Thus, in a loss-of-power situation, disconnection of the drivetrains 400 is insured to allowed undamped OPALOP operation (i.e., no motor backdriving). Also, the solenoid switches 824 of the drive-decouple converters 820 will become (or will remain) deenergized, and thus in the drive condition, whereby the actuator-position locks 826 cannot be in play.

The EMA Assembly 110

FIG. 10

The EMA assembly 110 comprises drive-decouple motors 300 (like the EMA assemblies 107-109), a decoupling crossover configuration (like the EMA assembly 108), and drivetrain-crossover converters 810 (like the EMA assembly 109).

The EMA assembly 110 operates in pretty much the same manner as the EMA assembly 109, but conversion time may be quicker in certain fault situations. For example, to convert to the M1D1-only mode or the M2D2-only mode, the drive-decouple converter 820 of the active motor 300 need only progress through its drive-decouple-drive shuttle. Motor-path conversion is not necessary. To convert to the M1D2-only mode or the M2D1-only mode, only one extra step is required. Specifically, the motor-patch converter 810 of the active motor 300 is moved to the opposite condition, and then the drive-decouple-drive shuttle is executed on the converter 820 of the inactive motor 300.

In the EMA assembly 110, as with the EMA assembly 109, converters 810 and 820 are such that the undamped OPALOP operation is possible upon loss of power. Particularly, the motor-path converters 810 will be disconnected from both motors 300 and the drive-decouple converters 820 will be unlocked.

The EMA Assembly 111

FIG. 11

The EMA assembly 111 can be the same or similar to the EMA assembly 107, and operated in the same manner. In the EMA assembly 111, like the EMA assembly 106, both couplers 500A and 500B are concentrated in one area of the assembly and this area is surrounded by a ballistic shield 90. The couplers 500 of the EMA assemblies 107-110 could placed in a similar arrangement for ballistic shielding or other purposes.

Closing

One may now appreciate that the EMA assembly 100 is operable in a plurality of fault-tolerant modes whereby it can survive fault conditions outside normal operation. In the M1D1-only mode and the M2D2-only mode, the EMA assembly 100 accommodates the most probable fault conditions (e.g., single-drive-rain-jam without motor malfunction) while maintaining control of the actuator. The modes of operation are testable thereby permitting evaluations (e.g., preflight inspections) of the EMA assembly 100 to confirm that it is prepared for fault situations.

As was indicated above, the electromechanical apparatus 100 can be used to control the movement of a flight-control-surface component 12 (e.g., a stabilizer, rudder, elevator, flap, aileron, spoiler, slat, etc.) relative to an aircraft structure. Instead of an aircraft, the structure can be part of a missile, rocket, spacecraft, ship, submarine, torpedo, or any other vehicle (or non-vehicle) wherein motion control of a component is necessary. Additionally or alternatively, the component 12 can be a nozzle-defining surface, a rudder, a hull, or any other compatible component. The EMA assembly 100, can be used in any actuating situation where jam tolerance, fault compensation, or OPALOP positioning is desired or necessary.

Although the EMA assembly 100, the actuator 200, the drive motors 300, the drive trains 400, the couplers 500, the decoupling trains 600, the decoupling motors 700, the mode-conversion system 800, and/or the predisposition devices 900 (and subassemblies, mechanisms, means, methods, and steps) have been shown and described with respect to a certain embodiments, it is obvious that equivalent alterations and modifications will occur to others skilled in the art upon the reading and understanding of this specification and the annexed drawings. In regard to the various functions performed by the above described (e.g., components, assemblies, mechanisms, systems, devices, compositions, etc.), the terms (including a reference to a "means") used to describe such are intended to correspond, unless otherwise indicated, to any element which performs the specified function of the described element (i.e., that is functionally equivalent), even though not structurally equivalent to the disclosed structure which performs the function. In addition, while a particular feature may have been described above with respect to only one or more of several illustrated embodiments, such a feature may be combined (or not combined) with one or more other features of the other embodiments, as may be desired and advantageous for any given or particular applications.

The invention claimed is:

1. An electromechanical actuating assembly, comprising:
an actuator;
a first motor providing actuator-moving power;
a second motor providing actuator-moving power independent of the first motor;
a first drivetrain for transferring actuator-moving power to the actuator;
a second drivetrain for transferring actuator-moving power to the actuator;
a first decoupling train for transmitting decoupling power to decouple the first drivetrain from the actuator;
a second decoupling train for transmitting decoupling power to decouple the second drivetrain from the actuator; and
wherein the assembly is operable in a plurality of fault-tolerant modes, including:
a M1D1-only mode, whereat actuator-moving power is transferred only through the first drivetrain and decoupling power transmitted through the second decoupling train decouples the second drivetrain from the actuator; and
a M2D2-only mode, whereat actuator-moving power is transferred only through the second drivetrain and decoupling power transmitted through the first decoupling train decouples the first drivetrain from the actuator; and
wherein the assembly further comprises a mode-conversion system for conversion to an appropriate one of the plurality of the fault-tolerant modes upon occurrence of a fault situation;
wherein the mode-conversion system comprises a first motor-path converter and a second motor-path converter;
wherein the first motor-path converter is convertible between a first condition whereat the first motor can be drivingly connected to the first drivetrain and a second condition whereat the first motor can be drivingly connected to the second drivetrain, and
wherein the second motor-path converter is convertible between a first condition whereat the second motor can be drivingly connected to the first drivetrain and a second condition whereat the second motor can be drivingly connected to the second drivetrain.

2. An electromechanical actuating assembly as set forth in claim 1, wherein the assembly is operable in a normal-operation mode, whereat actuator-moving power is transferred to the actuator through both the first drivetrain and the second drivetrain.

3. An electromechanical actuating assembly as set forth in claim 2, wherein, when the assembly is in the normal-operation mode, the first motor provides actuator-moving power to the first drivetrain and the second motor provides actuator-moving power to the second drivetrain.

4. An electromechanical actuating assembly as set forth in claim 1, wherein the first drivetrain comprises a first ballscrew and the second drivetrain comprises a second ballscrew.

5. An electromechanical actuating assembly as set forth in claim 1, further comprising a first coupler coupling the first drivetrain and the actuator, and a second coupler coupling the second drivetrain and the actuator;
wherein the first decoupling train reversibly decouples the first coupler when decoupling power is transmitted therethrough and the second decoupling train reversibly decouples the second coupler when decoupling power is transmitted therethrough.

6. An electromechanical actuating assembly as set forth in claim 5, wherein the first coupler linearly moves with the actuator when it is coupled to the first drivetrain, and wherein the second coupler linearly moves with the actuator when it is coupled to the second drivetrain.

7. An electromechanical actuating assembly as set forth in claim 6, wherein the first coupler comprises a ballnut and the second coupler comprises a ballnut.

8. An electromechanical actuating assembly as set forth in claim 1, wherein decoupling power is not provided by the first motor or the second motor.

9. An electromechanical actuating assembly, as set forth in claim 8, wherein a first decoupling motor provides decoupling power to the first decoupling train and wherein a second decoupling motor provides decoupling power to the second decoupling train.

10. An electromechanical actuating assembly as set forth in claim 1, wherein the fault-tolerant modes further comprise:
   a M2D1 mode whereat actuator-moving power is provided only by the second motor and is transferred only through the first drivetrain, and decoupling power transmitted through the second decoupling train decouples the second drivetrain from the actuator; and
   a M1D2-only mode whereat actuator-moving power is provided only by the first motor and is transferred only through the second drivetrain, and decoupling power transmitted through the first decoupling train decouples the first drivetrain from the actuator.

11. An electromechanical actuating assembly as set forth in claim 1, wherein each motor-path converter comprises a clutch.

12. An electromechanical actuating assembly as set forth in claim 1, wherein each motor-path converter comprises a solenoid switch.

13. An electromechanical actuating assembly as set forth in claim 1, wherein each motor-path converter is also convertible to a condition whereat the respective motor can be drivingly connected to neither the first drivetrain nor the second drivetrain.

14. An electromechanical actuating assembly as set forth in claim 1, wherein the first motor and/or the second motor provide the decoupling power.

15. An electromechanical actuating assembly as set forth in claim 1, wherein the mode-conversion system comprises:
   a first drive-decouple converter that converts between a drive condition, whereat one of the motors is drivingly connected to the first drivetrain, and a decouple condition, whereat this motor is drivingly connected to one of the first decoupling train or the second decoupling train; and
   a second drive-decouple converter that converts between a drive condition, whereat one of the motors is drivingly connected to the second drivetrain, and a decouple condition, whereat this motor is drivingly connected to one of the first decoupling train or the second decoupling train.

16. An electromechanical actuating assembly as set forth in claim 1, wherein the first coupler and the second coupler are positioned on same side of a centerline of the assembly.

17. An electromechanical actuating assembly as set forth in claim 13, wherein a first ballscrew and a second ballscrew are positioned on opposite sides of the centerline; and wherein the first coupler and the second coupler are protected by a ballistic shield.

18. A method of testing the electromechanical actuating assembly set forth in claim 1, said method comprising the steps of:
   transmitting decoupling power through the first decoupling train to decouple the first drivetrain from the actuator; and
   transmitting decoupling power through the first decoupling train to decouple the second drivetrain from the actuator;
   wherein the transmitting steps are performed by simulating a failure occurrence so that the mode conversion system converts the assembly to the appropriate failure-tolerant mode.

19. An aircraft comprising a flight-control surface component and the electromechanical actuating assembly set forth in claim 1, wherein the flight-control-surface component is attached to the actuator and moves in response to actuator-moving power provided to the actuator by the drivetrain(s).

* * * * *

UNITED STATES PATENT AND TRADEMARK OFFICE
CERTIFICATE OF CORRECTION

PATENT NO. : 8,136,418 B2  Page 1 of 1
APPLICATION NO. : 12/534168
DATED : March 20, 2012
INVENTOR(S) : Bruce W. Behar et al.

It is certified that error appears in the above-identified patent and that said Letters Patent is hereby corrected as shown below:

Front page, Section (63), Related U.S. Application Data should be added:
--Related U.S. Application Data

(63) Claims priority under 35 U.S.C. §120 to International Application No. PCT/US08/53273 filed on Feb. 7, 2008, which claimed priority to U.S. Provisional Patent Application No. 60/888,666 filed on Feb. 7, 2007; to U.S. Provisional Patent Application No. 60/892,310 filed on Mar. 1, 2007; to U.S. Provisional Patent Application No. 60/976,021 filed on Sep. 28, 2007; and which is a continuation-in-part of International Patent Application No. PCT/US07/77507 filed on Sep. 4, 2007.--

Signed and Sealed this
Twenty-eighth Day of August, 2012

David J. Kappos
*Director of the United States Patent and Trademark Office*

UNITED STATES PATENT AND TRADEMARK OFFICE
Certificate

Patent No. 8,136,418 B2            Patented: March 20, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Bruce W. Behar, Pasadena, CA (US); David J. Gurrola, Fillmore, CA (US); Dan T. Nguyen, Irvine, CA (US); and William R. Schley, Rancho Santa Margarita, CA (US).

Signed and Sealed this Fifteenth Day of July 2014.

TIMOTHY D. COLLINS
*Supervisory Patent Examiner*
Art Unit 3644
Technology Center 3600